United States Patent
Horiuchi et al.

(10) Patent No.: US 9,460,983 B2
(45) Date of Patent: Oct. 4, 2016

(54) JOINING STRUCTURE USING THERMAL INTERFACE MATERIAL

(75) Inventors: Michio Horiuchi, Nagano (JP); Yasue Tokutake, Nagano (JP); Yuichi Matsuda, Nagano (JP)

(73) Assignee: Shinko Electric Industries Co., LTD., Nagano-ken (JP)

( * ) Notice: Subject to any disclaimer, the term of this patent is extended or adjusted under 35 U.S.C. 154(b) by 804 days.

(21) Appl. No.: 13/613,720

(22) Filed: Sep. 13, 2012

(65) Prior Publication Data

US 2013/0081796 A1 Apr. 4, 2013

(30) Foreign Application Priority Data

Sep. 29, 2011 (JP) ................................ 2011-214946

(51) Int. Cl.
| | |
|---|---|
| H05K 7/20 | (2006.01) |
| H01L 23/367 | (2006.01) |
| H01L 23/433 | (2006.01) |
| H01L 21/48 | (2006.01) |
| H01L 21/50 | (2006.01) |
| H01L 23/373 | (2006.01) |

(52) U.S. Cl.
CPC ....... *H01L 23/3677* (2013.01); *H01L 21/4882* (2013.01); *H01L 21/50* (2013.01); *H01L 23/433* (2013.01); *H01L 23/3733* (2013.01); *H01L 23/3735* (2013.01); *H01L 2224/16225* (2013.01); *H01L 2224/32225* (2013.01); *H01L 2224/73204* (2013.01); *H01L 2224/73253* (2013.01); *H01L 2924/15311* (2013.01); *H05K 7/2039* (2013.01); *H05K 7/20509* (2013.01)

(58) Field of Classification Search
CPC ............. H01L 23/373; H01L 23/3733; H01L 23/3735; H05K 7/2039; H05K 7/20509
USPC ................................. 165/146, 185; 361/704
See application file for complete search history.

(56) References Cited

U.S. PATENT DOCUMENTS

| | | | | |
|---|---|---|---|---|
| 6,242,799 | B1 * | 6/2001 | Horiuchi et al. | 257/700 |
| 2003/0127727 | A1 * | 7/2003 | Suehiro et al. | 257/712 |
| 2009/0068387 | A1 * | 3/2009 | Panzer et al. | 428/40.1 |
| 2010/0321897 | A1 * | 12/2010 | Hill et al. | 361/720 |
| 2011/0291258 | A1 * | 12/2011 | Murayama et al. | 257/712 |

FOREIGN PATENT DOCUMENTS

| | | |
|---|---|---|
| JP | 11-068360 A | 3/1999 |
| JP | 2003-037228 A | 2/2003 |
| JP | 2003-110069 A | 4/2003 |
| JP | 2005-093842 A | 4/2005 |
| JP | 2006-024720 A | 1/2006 |

OTHER PUBLICATIONS

English Translation of Japanese Notification of Reasons for Refusal issued on Aug. 28, 2015 in connection with Japanese Patent Appln. No. 2011-214946, 8 pages.

\* cited by examiner

*Primary Examiner* — Leonard R Leo
(74) *Attorney, Agent, or Firm* — Wolf, Greenfield & Sacks, P.C.

(57) ABSTRACT

A thermal interface material includes a metal foil, which has a first surface and an opposite second surface, and a plurality of rod conductors each having a side surface extending in a thickness direction of the metal foil. The rod conductors are arranged on at least one of the first and second surfaces of the metal foil in a planar direction that is perpendicular to the thickness direction. A resin layer covers at least the first surface and the second surface of the metal foil and the side surfaces of the rod conductors.

1 Claim, 15 Drawing Sheets

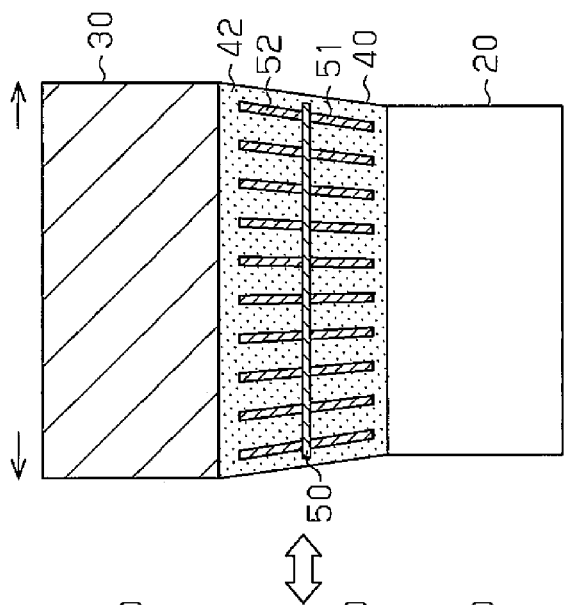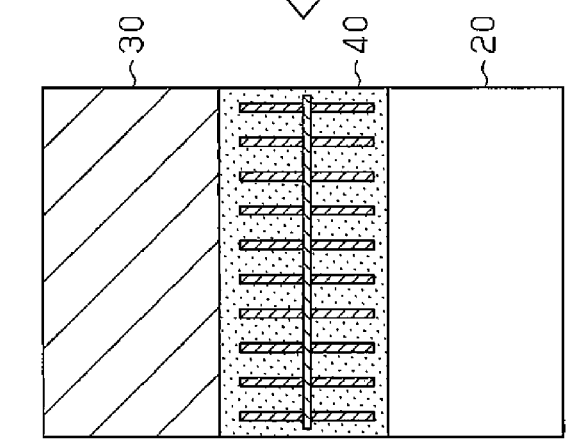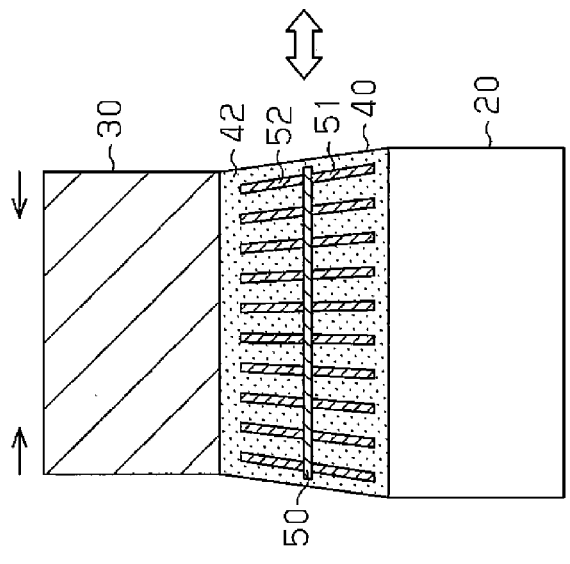

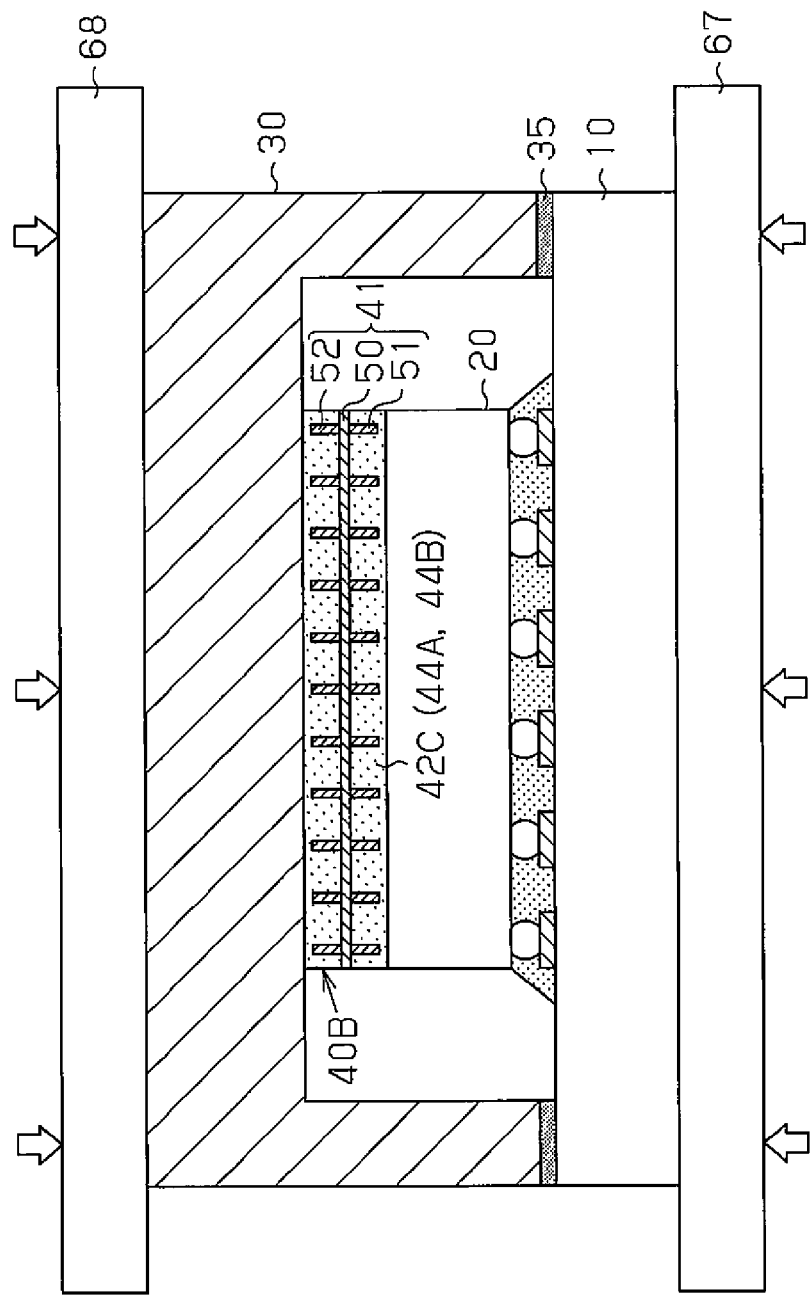

JOINING STRUCTURE USING THERMAL INTERFACE MATERIAL

CROSS-REFERENCE TO RELATED APPLICATIONS

This application is based upon and claims the benefit of priority from prior Japanese Patent Application No. 2011-214946, filed on Sep. 29, 2011, the entire contents of which are incorporated herein by reference.

FIELD

This disclosure relates to a thermal interface material, a method for manufacturing a thermal interface material, and a joining structure using a thermal interface material.

BACKGROUND

Semiconductor elements used in a central processing unit (CPU) or the like are electrically connected and fixed to a substrate in a semiconductor. The temperature of a semiconductor element rises when the semiconductor element is operated. Thus, the temperature of the semiconductor element has to be forcibly lowered. Otherwise, the semiconductor element may not be able to operate at full capacity. Hence, to improve the heat dissipation property of a semiconductor element, a heat radiation component (for example, a metal heat radiation plate) that releases the heat emitted from a semiconductor element into atmosphere may be arranged on a semiconductor element. This forms a path through which the heat emitted from a semiconductor element is externally released. In this case, a thermal interface material (TIM) is arranged between the semiconductor element and the heat radiation plate. The thermal interface material absorbs the unevenness in the surfaces of the semiconductor element and the heat radiation plate and thereby decreases the contact thermal resistance therebetween. By using the thermal interface material, heat is smoothly conducted from the semiconductor element to the heat radiation plate. Japanese Laid-Open Patent Publication Nos. 2003-037228 and 11-068360 describe examples of thermal interface materials.

FIG. 18A illustrates one example of a semiconductor device 100. A semiconductor element 120 is arranged on a wiring board 110. A heat radiation plate 130 is thermally coupled to a rear surface of the semiconductor element 120. The heat radiation plate 130 includes a recess 131 that accommodates the semiconductor element 120. The recess 131 includes a bottom surface 131A joined with the semiconductor element 120 by a thermal interface material 140. The thermal interface material 140 transfers heat from the semiconductor element 120 to the heat radiation plate 130 to prevent the temperature of the semiconductor element 120 from rising.

The thermal interface material 140 may be formed from an organic resin binder having a low elastic modulus and containing fillers of an inorganic material (e.g., silica, alumina, or boron nitride) having a higher thermal conductivity than an organic material or of a metal material (e.g., silver, copper, or nickel).

SUMMARY

In the thermal interface material 140, however, the thermal conductivity of the organic resin containing the fillers described above is not that high. To increase the thermal conductivity of the thermal interface material 140, the volume fraction of the fillers in the resin layer has to be increased. However, when the volume fraction of the fillers is increased, as illustrated in FIG. 18B, fillers 142 having a high elastic modulus will be dispersed throughout a resin layer 141. This increases the elastic modulus of the thermal interface material 140. Thus, the thermal interface material 140 may not be able to relieve the stress that is caused by the difference in thermal expansion coefficients between the semiconductor element 120 and the heat radiation plate 130. In this manner, the heat conductivity and stress relieving capability of the thermal interface material 140 are in a so-called tradeoff relationship. Accordingly, when the desired condition for one of the heat conductivity and stress relieving capability is met, the condition for the other one has to be compromised. Hence, the development of a thermal interface material having a high thermal conductivity and a high stress relieving capability is desired.

One aspect of this disclosure is a thermal interface material. The thermal interface material includes a metal foil including a first surface and an opposite second surface. A plurality of rod conductors each include a side surface extending in a thickness direction of the metal foil. The rod conductors are arranged on at least one of the first surface and the second surface of the metal foil in a planar direction that is perpendicular to the thickness direction. A resin layer covers at least the first surface and the second surface of the metal foil and the side surfaces of the rod conductors.

Other aspects and advantages of the invention will become apparent from the following description, taken in conjunction with the accompanying drawings, illustrating by way of example the principles of the invention.

BRIEF DESCRIPTION OF THE DRAWINGS

The embodiments, together with objects and advantages thereof, may best be understood by reference to the following description of the presently preferred embodiments together with the accompanying drawings in which:

FIGS. 2A to 2C are schematic diagrams illustrating the operation of the thermal interface material of FIG. 1B;

FIG. 9 is a schematic cross-sectional view of a thermal interface material and a semiconductor device in a modified example and illustrates a method for manufacturing the thermal interface material and the semiconductor device;

DESCRIPTION OF THE EMBODIMENTS

Embodiments will now be described with reference to the accompanying drawings. The accompanying drawings schematically illustrate structures and do not depict actual scale. Further, some resin layers may be illustrated without hatching layers in the cross-sectional views to facilitate understanding.

A first embodiment of a thermal interface material, a method for manufacturing a thermal interface material, and a joining structure using a thermal interface material will now be described below with reference to FIGS. 1 to 5.

Figure 1A:
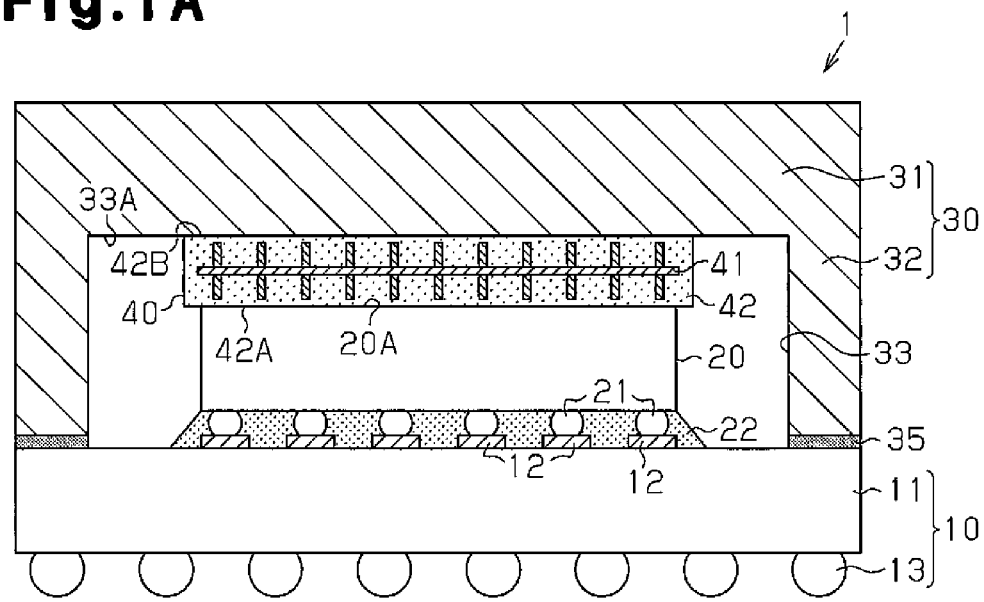
FIG. 1A is a schematic cross-sectional view of a semiconductor device according to a first embodiment.

As illustrated in FIG. 1A, a semiconductor device 1 includes a ball grid array (BGA) wiring board 10, a semiconductor element 20 mounted on the wiring board 10, a heat radiation plate 30 arranged above the semiconductor element 20, and a thermal interface material 40 that thermally couples the semiconductor element 20 and the heat radiation plate 30.

The wiring board 10 includes a board body 11, connecting pads 12, and solder balls 13. The connecting pads 12 and the solder balls 13 are electrically connected to each other through the inside of the board body 11. To establish the electric connections, a wiring layer may be formed inside the board body 11. As long as the connecting pads 12 and the solder ball 13 are electrically connected to each other, a wiring layer may be unnecessary. When a plurality of wiring layers is formed inside the board body 11, the wiring layers are laminated with interlayer insulating layers arranged between the wiring layers, and the connecting pads 12 and the solder balls 13 are electrically connected to each other by the wiring layers and vias formed in the insulating layers. As the board body 11, for example, a core build-up substrate, which includes a core substrate, or a coreless substrate, which does not include a core substrate, may be used.

The connecting pads 12 are formed on the upper surface of the board body 11. Examples of the material of the connecting pads 12 include metals such as copper.

The solder balls 13 are formed on the lower surface of the board body 11. Examples of the material of the solder balls 13 include alloys containing lead (Pb), an alloy of tin (Sn) and copper (Cu), an alloy of tin (Sn) and silver (Ag), and an alloy of Sn, Ag, and Cu. The solder balls 13 serve as external connection terminals connected to a mother board, for example.

The semiconductor element 20 includes a thin semiconductor substrate formed from silicon (Si) and the like. A semiconductor integrated circuit (not illustrated) is formed on an element formation surface (lower surface as viewed in FIG. 1A) of the semiconductor substrate. The element formation surface is coated with a passivation film. Connection terminals 21 are arranged on the element formation surface. As the semiconductor element 20, a logic chip, such as a CPU (central processing unit) chip or a GPU (graphics processing unit) chip, for example, may be used. Further, as the semiconductor element 20, a memory chip, such as a DRAM (dynamic random access memory) chip, an SRAM (static random access memory) chip, or a flash memory chip, for example, may be used. In the present embodiment, the semiconductor element 20 is formed from silicon and has a thermal expansion coefficient of about 3 ppm/° C. The dimensions of the semiconductor element 20 as viewed from above are about 10 mm by 10 mm, for example. The thickness of the semiconductor element 20 may be set to 10 to 50 μm, for example. The semiconductor element 20 is one example of a first member having a first thermal expansion coefficient.

The semiconductor element 20 is flip-chip joined to the wiring board 10. As illustrated in FIG. 1A, the semiconductor element 20 is electrically connected to the connecting pads 12 on the wiring board 10 by the connection terminals 21. As the connection terminals 21, gold (Au) bumps or solder bumps, for example, may be used. Examples of a material for solder bumps includes alloys containing Pb, an alloy of Sn and Cu, an alloy of Sn and Ag, and an alloy of Sn, Ag, and Cu.

The gap between the lower surface of the semiconductor element 20 and the upper surface of the wiring board 10 is filled with an underfill resin 22. Examples of the material of the underfill resin 22 include insulating resins such as epoxy resins.

The heat radiation plate 30 is arranged above the semiconductor element 20. The heat radiation plate 30 is also referred to as a "heat spreader". Examples of the material of the heat radiation plate 30 include copper (Cu), silver (Ag), aluminum (Al), Cu alloys, Ag alloys, and Al alloys. In the present embodiment, the heat radiation plate 30 is formed of Al and has a thermal expansion coefficient of about 23 ppm/° C. The heat radiation plate 30 is one example of a second member having a second thermal expansion coefficient.

The heat radiation plate 30 is joined to the wiring board 10. As illustrated in FIG. 1A, the heat radiation plate 30 is joined by using a joining material 35 arranged on a peripheral part of the wiring board 10 such that the heat radiation plate 30 surrounds the semiconductor element 20. Examples of the material of the joining material 35 include silicon polymer-based resins.

The heat radiation plate 30 includes a plate-shaped portion 31 and a frame-shaped sidewall portion 32, which is formed integrally with the peripheral part of the plate-shaped portion 31. The bottom surface of the sidewall portion 32 is joined to the wiring board 10 by the joining material 35. The heat radiation plate 30 include a recess 33 defined by the plate-shaped portion 31 and the sidewall portion 32. The recess 33 and the wiring board 10 define an accommodation portion that accommodates the semiconductor element 20. The dimensions of the heat radiation plate 30 as viewed from above are about 20 mm by 20 mm to 40 mm by 40 mm, for example. Further, the thickness of the plate-shaped portion 31 of the heat radiation plate 30 may be set to about 0.5 to 4 mm, for example.

The surface of the semiconductor element 20 opposite to the element formation surface, that is, the upper surface of as viewed in FIG. 1A, is thermally coupled to the inner bottom surface 33A of the recess 33 of the heat radiation plate 30 by the thermal interface material 40. This transfers and releases the heat generated by the semiconductor element 20 to the heat radiation plate 30 through the thermal interface material 40.

Figure 1B:
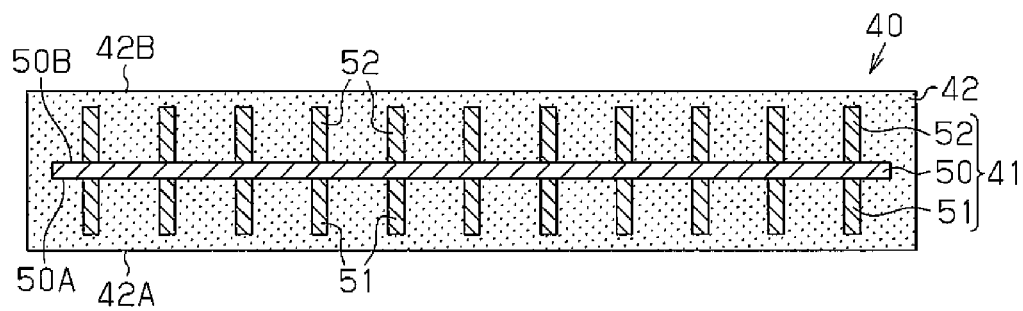
FIG. 1B is a schematic cross-sectional view of a thermal interface material arranged between a semiconductor element and a heat radiation plate in the semiconductor device of FIG. 1A.

The thermal interface material 40 includes a metal layer 41 and a resin layer 42, which covers the metal layer 41. The metal layer 41 has a cross-sectional structure that includes cross-shaped portions continuously formed in the lateral direction (sideward direction as viewed in FIG. 1A). In the present embodiment, as illustrated in FIG. 1B, the metal layer 41 includes a thin metal foil 50, a plurality of first rod conductors 51, and a plurality of second rod conductors 52. The rod conductors 51 and 52 are, for example, cylindrical-shaped. The first rod conductors 51, which extend in the direction of the thickness of the metal foil 50 (the thermal interface material 40), are parallel and formed on a first surface 50A of the metal foil 50. The second rod conductors 52, which extend in the direction of the thickness of the metal foil 50, are parallel and formed on the second surface 50B of the metal foil 50. The metal layer 41 serves to transfer the heat generated by the semiconductor element 20 to the heat radiation plate 30. As the material for the metal layer 41 (the metal foil 50, the first rod conductors 51, and the second rod conductors 52), a material having high thermal conductivity may be used. Examples of the material for the metal layer 41 include metals such as copper and aluminum. In the present embodiment, the metal layer 41 is formed from copper and has a thermal expansion coefficient of about 17 ppm/° C.

Figure 1C:
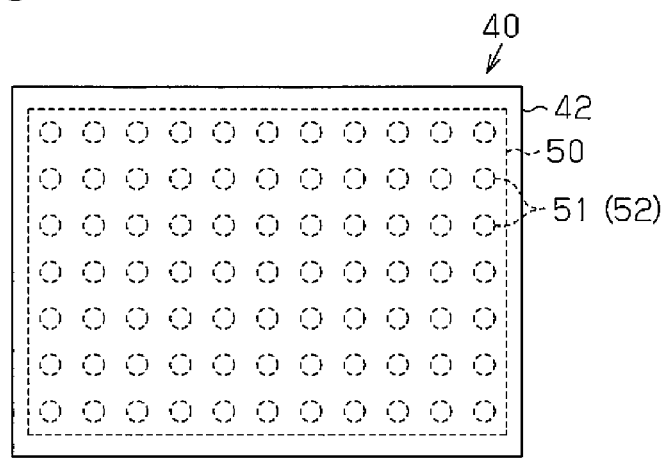
FIG. 1C is a schematic plan view of the thermal interface material of FIG. 1B.

The metal foil 50 is formed in a middle part with respect to the thickness direction of the resin layer 42. As illustrated in FIG. 1C, the metal foil 50 is tetragonal, for example, as viewed from above. The metal foil 50 is slightly smaller than the resin layer 42 as viewed from above. The thickness of the metal foil 50 may be set to about 5 to 10 μm, for example.

As illustrated in FIG. 1B, the first rod conductors 51 extend from the first surface 50A of the metal foil 50 toward the lower surface 42A of the resin layer 42 in the thickness direction (stacked direction) of the thermal interface material 40. As illustrated in FIG. 1C, the first rod conductors 51 are circular as viewed from above, for example. The first rod conductors 51 are arranged on the first surface 50A of the metal foil 50 in the planar direction. In the present embodiment, the first rod conductors 51 are arranged on a surface (the first surface 50A) of the metal foil 50 in matrix form (e.g., 7 rows and 11 columns as illustrated in FIG. 1C).

The height and diameter of the first rod conductors 51 are set in accordance with the thermal conductivity necessary for the thermal interface material 40, for example. Further, the pitch between the first rod conductors 51 is set in accordance with the thermal conductivity necessary for the thermal interface material 40 and the aspect ratio of the first rod conductors 51, for example. The height of the first rod conductors 51 may be set to, for example, 10 to 100 μm, the diameter of the first rod conductors 51 may be set to, for example, 10 to 500 μm, and the pitch between the first rod conductors 51 may be set to, for example. 10 to 500 μm. When the diameter of the first rod conductors 51 is less than 10 μm, the yield of the thermal interface material 40 becomes extremely poor. When the diameter of the first rod conductors 51 is greater than 500 μm, the first rod conductors 51 resists deformation.

The first rod conductors 51 do not have to be shaped to be circular as viewed from above and may be polygonal, for example, tetragonal, pentagonal, or hexagonal. Further, the layout of the first rod conductors 51 is not limited to the matrix form and may be in a hexagonal form, for example.

As illustrated in FIG. 1B, the second rod conductors 52 extend from the second surface 50B of the metal foil 50 toward the upper surface 42B of the resin layer 42 in the thickness direction (stacked direction) of the thermal interface material 40. As illustrated in FIG. 1C, the second rod conductors 52 are shaped to be circular as viewed from above, for example. The second rod conductors 52 are arranged on the second surface 50B of the metal foil 50 in the planar direction. In the present embodiment, the second rod conductors 52 are arranged on a surface (the second surface 50B) of the metal foil 50 in a matrix form (e.g., 7 rows and 11 columns as illustrated in FIG. 1C). Further, the second rod conductors 52 are overlapped with the first rod conductors 51 as viewed from above. That is, as illustrated in the cross-sectional view of FIG. 1B, the first rod conductors 51 and the second rod conductors 52 intersect the metal foil 50 so as to form crosses. However, the first and second rod conductors 51 and 52 do not have to intersect the metal foil 50 so as to form accurate crosses as long as they intersect and form shapes close to crosses. That is, the first rod conductors 51 and the second rod conductors 52 do not have to be completely overlapped with each other as viewed from above. For example, the first rod conductors 51 may be formed at positions separated from the second rod conductors 52 as viewed from above.

The height of the second rod conductors 52 may be set to, for example, 10 to 100 μm, and the diameter of the second rod conductors 52 may be set to, for example, 10 to 500 μm. The pitch between the second rod conductors 52 may be set to, for example, 10 to 500 μm. Further, the second rod conductors 52 do not have to be shaped to be circular as viewed from above and may be polygonal, for example, tetragonal, pentagonal, or hexagonal. Further, the layout of the second rod conductors 52 is not limited to the matrix form and may be in a hexagonal form, for example.

The resin layer 42 is formed to entirely cover the metal layer 41 (the metal foil 50, the first rod conductors 51, and the second rod conductors 52). The resin layer 42 function to join the semiconductor element 20, which is arranged on the lower surface 42A of the resin layer 42, with the heat radiation plate 30, which is arranged on the upper surface 42B of the resin layer 42. Further, the resin layer 42 functions to relieve stress caused by the difference in thermal expansion coefficients between the semiconductor element 20 and the heat radiation plate 30. As the material of the resin layer 42, which functions as described above, an insulating resin having a low elastic modulus (about 1 to 300 MPa, for example) may be used. Examples of the material for the resin layer 42 include silicone resins and epoxy resins. The thickness of the resin layer 42 may be set to about 10 to 100 μm, for example.

The operation of the semiconductor device 1 will now be described.

Figure 18A:
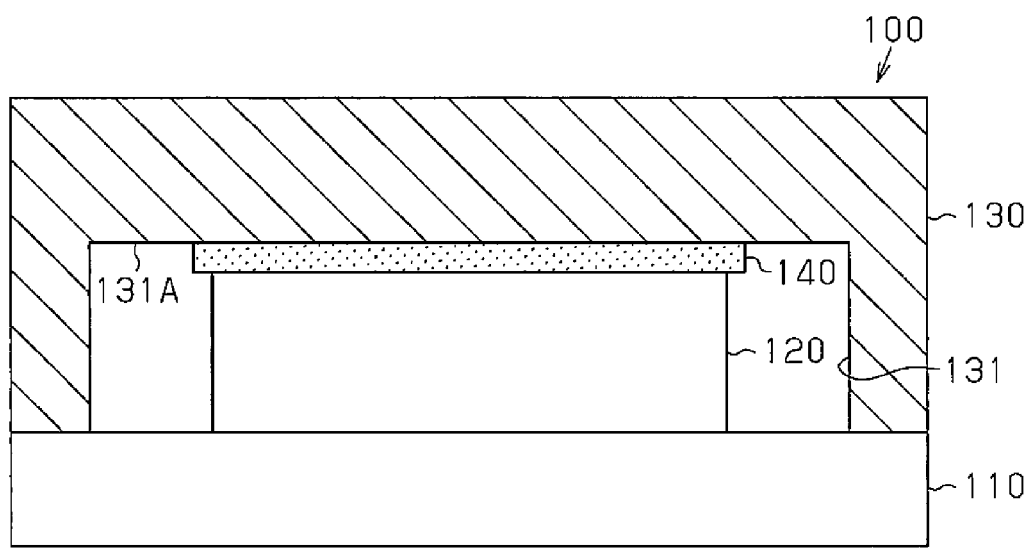
FIG. 18A is a schematic cross-sectional view of a semiconductor device in the related art.
Figure 18B:
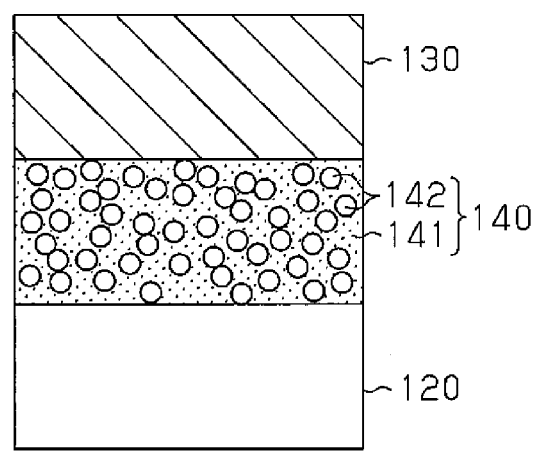
FIG. 18B is a schematic cross-sectional view of a thermal interface material arranged between a semiconductor element and a heat radiation plate in the semiconductor device of FIG. 18A.

The first and second rod conductors 51 and 52, which are arranged in the resin layer 42 of the thermal interface material 40, extend in the thickness direction of the thermal interface material 40 and are arranged in the planar direction. In this manner, the first and second rod conductors 51 and 52 having high thermal conductivity extend in the thickness direction (stacked direction) that is the direction in which heat is required to be transferred. Thus, when the content of the metal material in the resin layer 42 is the same as the content of the metal filler in the thermal interface material 140 in the related art (see FIG. 18B), the coefficient of thermal conductivity per volume fraction in the thickness direction of the thermal interface material 40 may be increased from that of the thermal interface material 140 of the related art. Hence, the thermal interface material 40 efficiently transfers the heat generated by the semiconductor element 20 to the heat radiation plate 30. The coefficient of thermal conductivity per volume fraction in the planar direction for the thermal interface material 40 is low compared with that of the thermal interface material 140 in the related art. However, to transfer the heat generated by the semiconductor element 20 to the heat radiation plate 30, thermal conductivity between joined members (the semiconductor element 20 and the heat radiation plate 30 in the present embodiment), that is, thermal conductivity in the thickness direction is important, whereas thermal conductivity in the planar direction is insignificant. Therefore, the first and second rod conductors 51 and 52 extend in the thickness direction, and the thermal interface material 40 thus has anisotropic thermal conductivity. This obtains high thermal conductivity even when the content of the metal material in the resin layer 42 is low.

The first rod conductors 51 and the second rod conductors 52 are arranged in the planar direction. Thus, the resin layer 42 of the thermal interface material 40 is easily elastic deformed in the planar direction, and stress in the planar direction caused by the difference in thermal expansion coefficients between the joined members may be relieved. For example, referring to FIG. 2B, when the temperature decreases from the joining temperature at which the semiconductor element 20 and the heat radiation plate 30 are joined by the thermal interface material 40 (see FIG. 2A), the heat radiation plate 30, which has a high thermal expansion coefficient, contracts in the planar direction much more than the semiconductor element 20. Here, the resin layer 42, which has a low elastic modulus, undergoes elastic deformation so as to absorb the difference in thermal expansion coefficients between the semiconductor element 20 and the heat radiation plate 30. In the thermal interface material 40 of the present embodiment, the first rod conductors 51 and the second rod conductors 52 do not restrict elastic deformation in the planar direction of the resin layer 42. This relieves stress in the planar direction caused by the difference in thermal expansion coefficients between the semiconductor element 20 and the heat radiation plate 30. That is, the stress-relieving capability of the thermal interface material 40 is increased from the stress-relieving capability of the thermal interface material 140 in the related art (FIG. 1B). The resin layer 42 includes the metal foil 50 that extends in the planar direction. The thermal expansion coefficient of the metal foil 50 (in the present embodiment, 17 ppm/° C.) is a value between the thermal expansion coefficient of the semiconductor element 20 (in the present embodiment, 3 ppm/° C.) and the thermal expansion coefficient of the heat radiation plate 30 (in the present embodiment, 23 ppm/° C.). Therefore, the deformation amount of (contraction amount) in the planar direction of the metal foil 50 is between the deformation amount of the semiconductor element 20 and the deformation amount of the heat radiation plate 30. Further, the metal foil 50 is provided at the middle part between the upper surface 42B and the lower surface 42A of the resin layer 42. Thus, the metal foil 50 is contracted in the same manner as the resin layer 42, and the metal foil 50 does not restrict the elastic deformation of the resin layer 42.

In the same manner, referring to FIG. 2C, when the temperature rises from the joining temperature (see FIG. 2A), the heat radiation plate 30, which has a high thermal expansion coefficient, expands in the planar direction much more than the semiconductor element 20. Here, the resin layer 42, which has a low elastic modulus, undergoes elastic deformation and absorbs the difference in thermal expansion coefficients between the semiconductor element 20 and the heat radiation plate 30. In the same manner as described above, the first rod conductors 51 and the second rod conductors 52 do not restrict elastic deformation in the planar direction of the resin layer 42. Therefore, the elastic deformation of the resin layer 42 absorbs the difference in thermal expansion coefficients between the semiconductor element 20 and the heat radiation plate 30. This relieves stress in the planar direction caused by the difference in thermal expansion coefficients between the semiconductor element 20 and the heat radiation plate 30.

The metal foil 50, which extends in the planar direction, is connected to all of the first and second rod conductors 51 and 52. Thus, the metal foil 50 disperses the heat transferred to the first and second rod conductors 51 and 52 in the planar direction. This evenly distributes heat.

A method for manufacturing the semiconductor device 1 will now be described. A method for manufacturing the thermal interface material 40 will first be described.

Figure 3A:
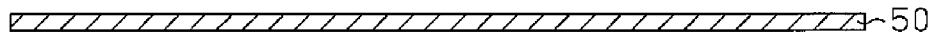
FIGS. 3A to 3E are schematic cross-sectional views of the thermal interface material of FIG. 1B illustrating a method for manufacturing the thermal interface material.

To manufacture the thermal interface material 40, the metal foil 50 is prepared as illustrated in FIG. 3A. Here, a copper foil is prepared as the metal foil 50.

Figure 3B:
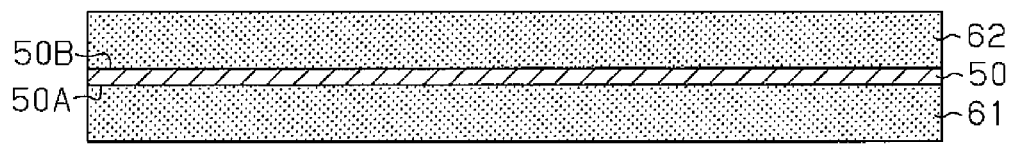

In the step illustrated in FIG. 3B, insulating layers 61 and 62 are formed on the two surfaces of the metal foil 50. The insulating layer 61 is formed to cover the first surface 50A of the metal foil 50, and the insulating layer 62 is formed to cover the second surface 50B of the metal foil 50. As the material of the insulating layers 61 and 62, either one of a photosensitive material and a non-photosensitive material may be used. For example, as the insulating layers 61 and 62, a dry film resist or a liquid resist may be used. When a dry film resist is used as the insulating layers 61 and 62, dry film is laminated on the two surfaces of the metal foil 50 through thermal compression bonding to form the insulating layers 61 and 62. When a liquid resist is used as the insulating layers 61 and 62, screen printing, spray coating, roll coating, or the like is performed to form the insulating layers 61 and 62. The thickness of the insulating layers 61 and 62 is about 10 to 100 μm, for example.

Figure 3C:
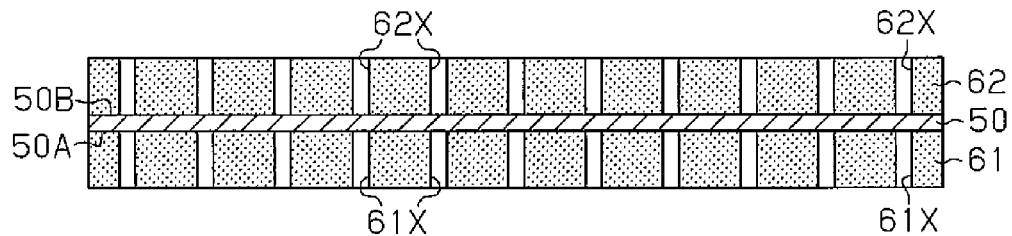

In the step illustrated in FIG. 3C, openings 61X are formed at given portions in the insulating layer 61 so as to expose the first surface 50A of the metal foil 50. Further, openings 62X are formed at given portions in the insulating layer 62 so as to expose the second surface 50B of the metal foil 50. The openings 61X exposing the first surface 50A of the metal foil 50 are formed at portions corresponding to formation regions for the first rod conductors 51. The openings 62X exposing the second surface 50B of the metal foil 50 are formed at portions corresponding to formation regions for the second rod conductors 52. The openings 61X and 62X may be formed by laser processing, for example. Further, when a photosensitive material is used as the material for the insulating layers 61 and 62, the insulating layers 61 and 62 on the two surfaces of the metal foil 50 may be exposed and developed to pattern and form the openings 61X and 62X.

Figure 3D:
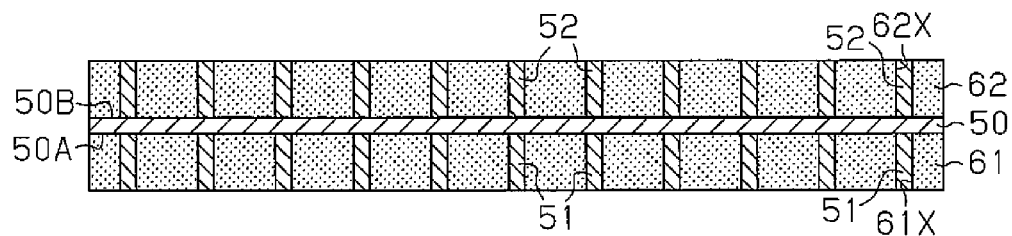

In the step illustrated in FIG. 3D, the first and second surfaces 50A and 50B of the metal foil 50 undergo electroplating using the metal foil 50 as a plating power supplying layer and using the insulating layers 61 and 62 as plating masks. By electroplating (copper electroplating in the present embodiment) the first surface 50A of the metal foil 50 exposed from the openings 61X of the insulating layer 61, the first rod conductors 51 are arranged on the first surface 50A. By copper electroplating the second surface 50B of the metal foil 50 exposed from the openings 62X of the insulating layer 62, the second rod conductors 52 are arranged on the second surface 50B. The first and second rod conductors 51 and 52 may be formed by, for example, filling paste into the openings 61X and 62X.

Figure 3E:
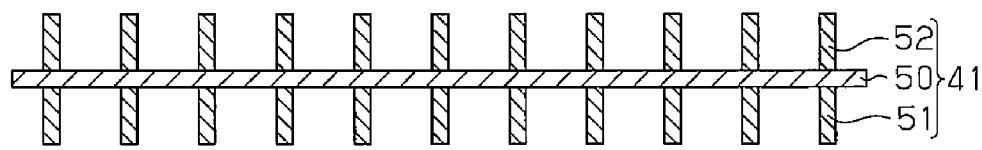

In the step illustrated in FIG. 3E, the insulating layers 61 and 62 used as the plating masks are removed. For example, when a dry film resist is used as the material for the insulating layers 61 and 62, the insulating layers 61 and 62 may be removed using an alkaline solution such as sodium hydroxide or monoethanolamine. When a liquid resist, such as a novolac resin or an epoxy resin, is used as the material for the insulating layers 61 and 62, the insulating layers 61 and 62 may be removed using acetone, alcohol, or the like. This forms the metal layer 41 with the metal foil 50 and the first and second rod conductors 51 and 52.

Figure 4A:
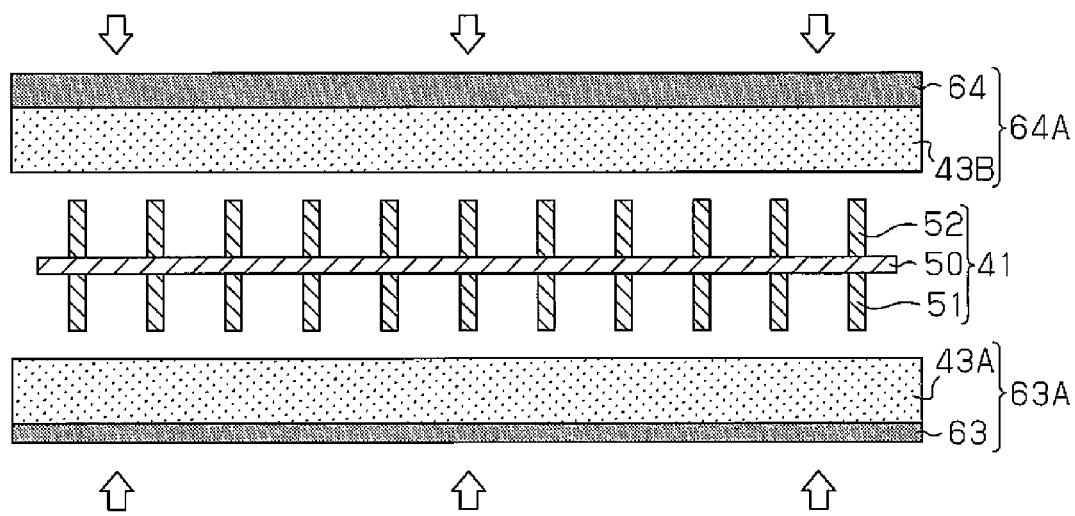
FIGS. 4A and 4B are schematic cross-sectional views of the thermal interface material of FIG. 1B illustrating a method for manufacturing the thermal interface material.

In the step illustrated in FIG. 4A, structural elements 63A and 64A are prepared. The structural element 63A is formed adhering a sheet of insulating resin 43A, which becomes the resin layer 42 (FIG. 1A), to a protective film 63. The structural element 64A is formed by adhering a sheet of insulating resin 43B, which becomes the resin layer 42 (FIG. 1A) to a protective film 64. As the protective films 63 and 64, a film formed by laminating a thin fluororesin (ETFE) layer on a polyester film or a polyethylene terephthalate (PET) film, a film formed by applying a parting agent to a surface of a polyester film or a PET film, or the like may be used. As the parting agent, a silicone-based parting agent or a fluorine-based parting agent may be used. The insulating resins 43A and 43B are respectively adhered to the surfaces of the protective films 63 and 64 to which the parting agent has been applied. The thickness of the protective films 63 and 64 may be set at about 10 to 50 µm, for example. As the insulating resins 43A and 43B, a thermosetting resin having a low elastic modulus, such as a silicone resin or an epoxy resin, may be used. The insulating resins 43A and 43B are used in a B-stage state (semi-cured state). It is preferable that the insulating resins 43A and 43B be formed from the same material.

Figure 4B:
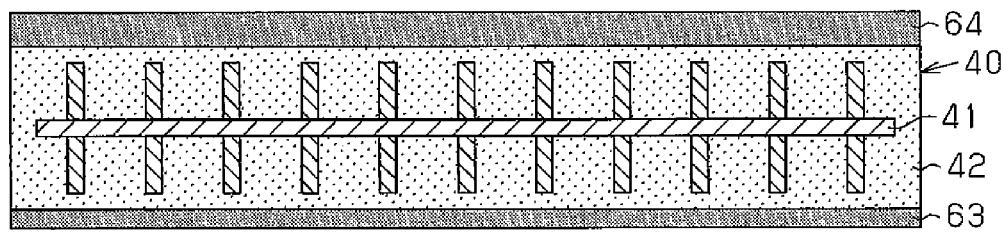

In the step illustrated in FIG. 4A, the structural element 63A is arranged on the lower side of the metal layer 41 (first rod conductors 51), and the structural element 64A is arranged on the upper side of the metal layer 41 (second rod conductors 52). The structural element 63A is arranged in a state in which the insulating resin 43A is directed upward so that the insulating resin 43A faces toward the metal layer 41. Likewise, the structural element 64A is arranged in a state in which the insulating resin 43B is directed downward so that the insulating resin 43B faces toward the metal layer 41. Then, thermal compression bonding is performed to laminate the two the structural elements 63A and 64A with the metal layer 41 arranged between the structural elements 63A and 64A. As illustrated in FIG. 4B, the thermal compression bonding forms the resin layer 42 with the insulating resins 43A and 43B and press-fits the metal layer 41 into the resin layer 42. This covers the metal layer 41 with the resin layer 42 and forms the thermal interface material 40. In the thermal interface material 40, the upper and lower surfaces of the resin layer 42 are respectively covered by the protective film 63 and the protective film 64. In this step, the sheets of insulating resins 43A and 43B (i.e., the resin layer 42) are not thermally cured and are kept in the B-stage state. By laminating the insulating resins 43A and 43B in a vacuum atmosphere, the formation of voids in the insulating resins 43A and 43B may be prevented.

A method for manufacturing the semiconductor device 1 will now be described.

Figure 5A:
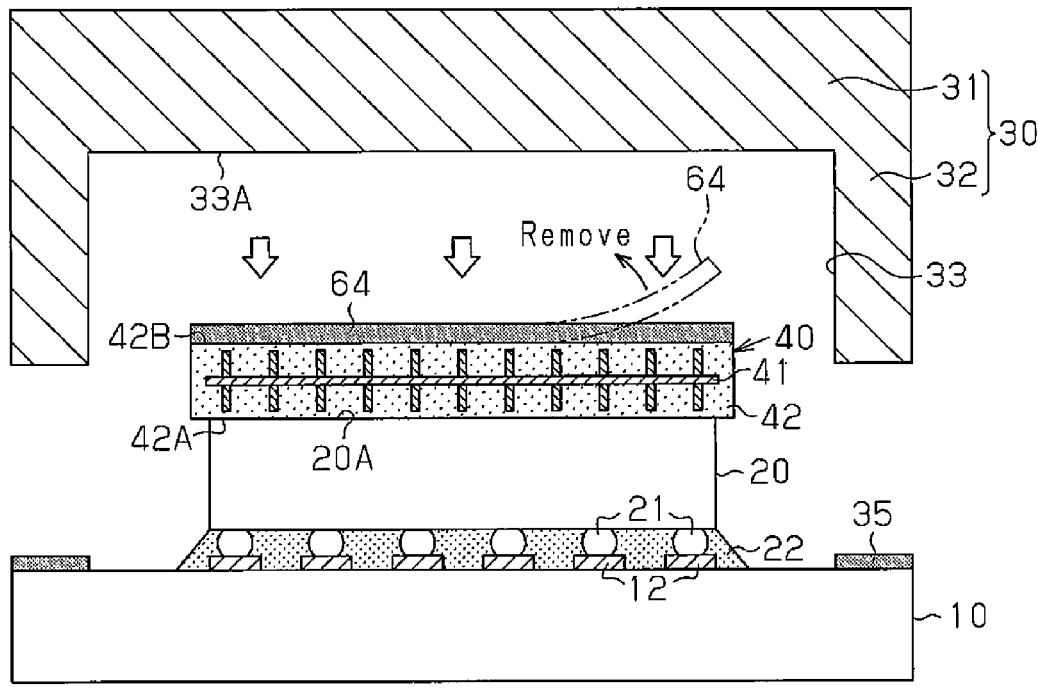
FIGS. 5A and 5B are schematic cross-sectional views of the semiconductor device of FIG. 1A illustrating a method for manufacturing the semiconductor device.

First, as illustrated in FIG. 5A, the wiring board 10 on which the semiconductor element 20 is mounted is prepared. Although not illustrated in the drawings, an example of the manufacturing of wiring board 10 will now be briefly described. The wiring board 10 with the connecting pads 12 is formed. Then, the connection terminals 21 for the semiconductor element 20 are flip-chip joined to the connecting pads 12, which are formed on the upper surface of the wiring board 10. An underfill resin 22 is formed between the wiring board 10 and the semiconductor element 20.

Subsequently, in the step illustrated in FIG. 5A, the thermosetting joining material 35 is applied to the peripheral part of the upper surface of the wiring board 10 in a frame-shaped manner. Further, the protective film 63 adhered to the thermal interface material 40 of FIG. 4B is removed to expose the lower surface 42A of the resin layer 42. Then, the lower surface 42A of the resin layer 42 is brought into contact with the upper surface 20A of the semiconductor element 20 to arrange the thermal interface material 40 on the semiconductor element 20. Afterward, the protective film 64 adhered to the thermal interface material 40 is removed. Then, the heat radiation plate 30, which is manufactured by undergoing forging, machining, or the like, is arranged on the wiring board 10 and the semiconductor element 20. The heat radiation plate 30 is arranged on the wiring board 10 and the semiconductor element 20 so that the bottom surface of the sidewall portion 32 of the heat radiation plate 30 faces the joining material 35 and so that the inner bottom surface 33A of the recess 33 of the heat radiation plate 30 faces the upper surface 42B of the resin layer 42.

Figure 5B:
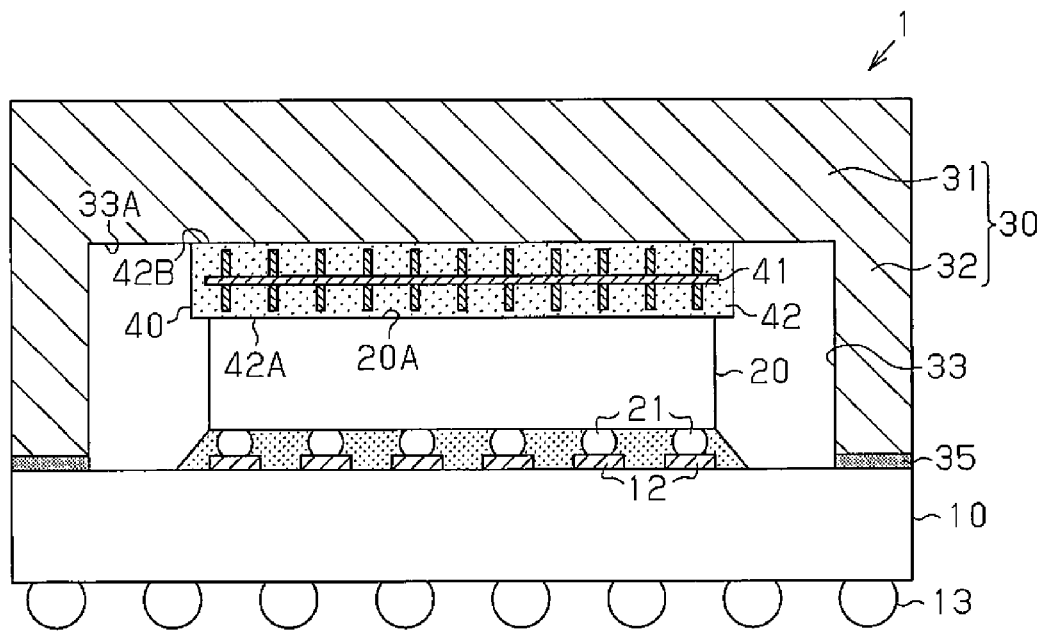

Next, the wiring board 10, the heat radiation plate 30, and the thermal interface material 40, which are arranged as described above, are heated and pressed. As a result, as illustrated in FIG. 5B, the joining material 35 and the resin layer 42 are cured in a state in which the sidewall portion 32 of the heat radiation plate 30 is in contact with the joining material 35 and the inner bottom surface 33A of the heat radiation plate 30 is in contact with the thermal interface material 40. This joins the heat radiation plate 30 and the wiring board 10 with the joining material 35 and joins the heat radiation plate 30 and the semiconductor element 20 with the heat interface material 40. For example, the wiring board 10 on which the semiconductor element 20 is mounted, the thermal interface material 40, and the heat radiation plate 30 are stacked and arranged between two heating press plates. Then, a vacuum press heats and presses the stacked structure from above and below to form the integral structure illustrated in FIG. 5B. Subsequently, the solder balls 13 are formed to manufacture the semiconductor device 1 of FIG. 1A.

The first embodiment has the advantages described below.

(1) The first and second rod conductors 51 and 52 are arranged in the resin layer 42 of the thermal interface material 40. The first and second rod conductors 51 and 52 extend in the thickness direction and are arranged in the planar direction. This increases the coefficient of thermal conductivity per volume fraction in the thickness direction of the thermal interface material 40. Further, the first rod conductors 51 and the second rod conductors 52 do not restrict elastic deformation in the planar direction of the resin layer 42. Hence, the difference in thermal expansion coefficients between the semiconductor element 20 and the heat radiation plate 30 may be absorbed by the elastic deformation of the resin layer 42. Accordingly, stress in the planar direction caused by the difference in thermal expansion coefficients between the joined members (the semiconductor element 20 and the heat radiation plate 30) may be relieved in a preferable manner. That is, the stress relieving capability of the thermal interface material 40 may be increased.

(2) The metal foil 50, which is arranged in the planar direction, may be connected to all of the first and second rod conductors 51 and 52. Thus, the heat transferred to the first and second rod conductors 51 and 52 may be dispersed in the planar direction by the metal foil 50. This evenly distributes the heat.

(3) The arrangement of the metal foil 50 allows the thermal interface material 40 to be manufactured in a state in which the first and second rod conductors 51 and 52 are connected to the metal foil 50.

The first embodiment may be modified as described below.

In the first embodiment, the first rod conductors 51 and the second rod conductors 52 are formed to substantially be in line symmetry using the metal foil 50 as a line of symmetry. That is, the first rod conductors 51 and the second rod conductors 52 have substantially the same heights. However, the height of the first and second rod conductors 51 and 52 do not necessarily have to be the same. The ratio between the height of the first rod conductors 51 and the height of the second rod conductors 52 may be adjusted in accordance with the difference in thermal expansion coefficients between the metal layer 41 and the joined members (in the first embodiment, the semiconductor element 20 and the heat radiation plate 30). For example, the ratio between the height of the first rod conductors 51 and the height of the second rod conductors 52 may be adjusted to be the same as the ratio between the difference in thermal expansion coefficients of one of the joined members and the metal layer 41 and the difference in thermal expansion coefficients between the other one of the joined members and the metal layer 41. This will now be described in more detail. For example, when the thermal expansion coefficient of the semiconductor element 20 formed from silicon is about 3 ppm/.degree. C., the thermal expansion coefficient of the heat radiation plate 30 formed from aluminum is about 23 ppm/.degree. C., and the thermal expansion coefficient of the metal layer 41 formed from copper is about 17 ppm/.degree. C., the difference in thermal expansion coefficients between the semiconductor element 20 and the metal layer 41 is 14 ppm/.degree. C., and the difference in thermal expansion coefficients between the heat radiation plate 30 and the metal layer 41 is 6 ppm/.degree. C. In this case, the heights of the first and second rod conductors 51 and 52 are adjusted such that the ratio between the height H1 of the first rod conductors 51 and the height H2 of the second rod conductors 52 (H1:H2) is close to 14:6. In other words, the metal foil 50 may be separated from the central position of the resin layer 42 such that the metal foil 50 is brought physically close to one of the joined members having a thermal expansion coefficient close to that of the metal foil 50. In this structure, the deformation amount of the metal foil 50 may be brought close to the elastic deformation amount of the resin layer 42 at a planar position where the metal foil 50 is located. This prevents the metal foil 50 from restricting elastic deformation of the resin layer 42, and the stress relieving capability of the thermal interface material 40 may be further improved.

Figure 6:
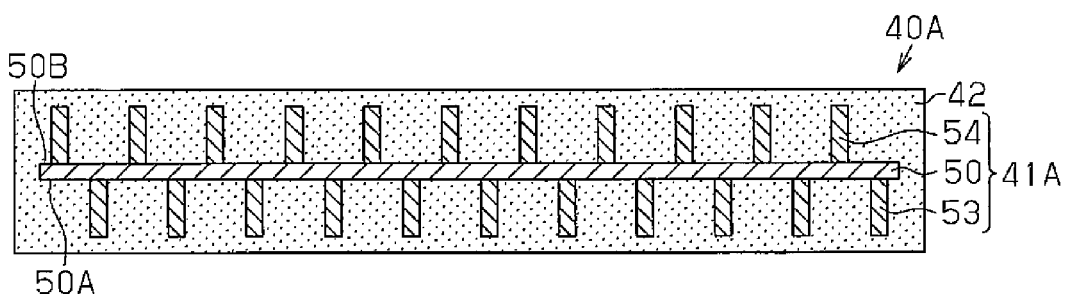
FIG. 6 is a schematic cross-sectional view of a modified example of a thermal interface material.

In the first embodiment, the first rod conductors 51 and the second rod conductors 52 are formed to substantially be in line symmetry using the metal foil 50 as a line of symmetry. However, there is no such limitation. For example, as illustrated in FIG. 6, the first rod conductors 53 and second rod conductors 54 may be arranged on the two surfaces of the metal foil 50 in a non-overlapping manner. For example, each second rod conductor 54 may be formed in correspondence with a recess formed between adjacent ones of the first rod conductors 53, and each first rod conductor 53 may be formed in correspondence with a recess formed between adjacent ones of the second rod conductors 54.

A method for manufacturing a metal layer 41A of a thermal interface material 40A of FIG. 6 will now be described.

Figure 7A:
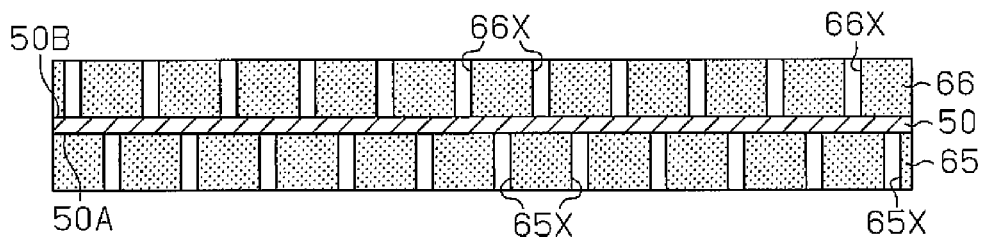
FIGS. 7A to 7C are schematic cross-sectional views of the thermal interface material of FIG. 6 illustrating a method for manufacturing the thermal interface material.

First, as illustrated in FIG. 7A, an insulating layer 65 including openings 65X is formed on a first surface 50A of the metal foil 50. In the same manner, an insulating layer 66 including openings 66X is formed on a second surface 50B of the metal foil 50. The openings 65X, which expose the first surface 50A of the metal foil 50, are formed at portions corresponding to formation regions for the first rod conductors 53. The openings 66X, which expose the second surface 50B of the metal foil 50, are formed at portions corresponding to formation regions for the second rod conductors 54. The openings 65X and 66X may be formed by laser processing or photolithography, for example. The openings 65X and 66X are formed at separated positions as viewed from above. Thus, there is no need to position and align the openings 65X and 66X with each other. That is, there is no need to align the openings 65X and 66X with high accuracy.

Figure 7B:
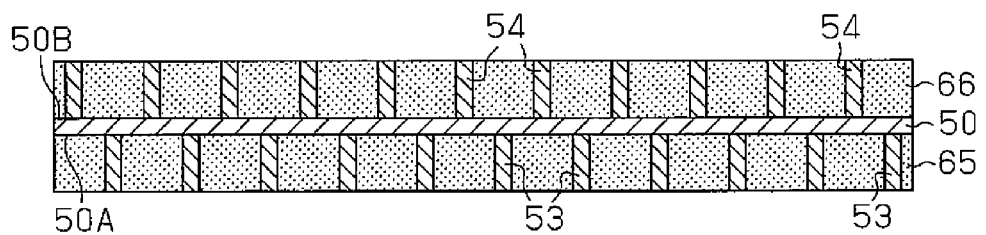
Figure 7C:
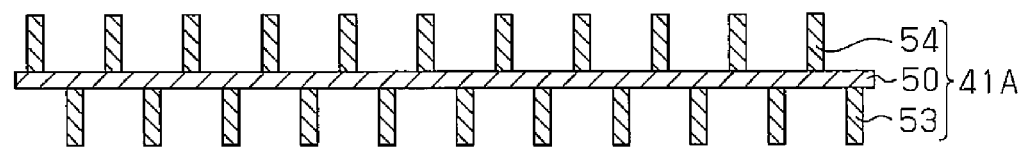

In the next step illustrated in FIG. 7B, the first surface 50A and the second surface 50B of the metal foil 50 undergo electroplating using the metal foil 50 as a plating power supplying layer and using the insulating layers 65 and 66 as plating masks. As a result, the first rod conductors 53 are formed on the first surface 50A of the metal foil 50, and the second rod conductors 54 are formed on the second surface 50B of the metal foil 50. Then, in the step illustrated in FIG. 7C, the insulating layers 65 and 66 used as the plating masks are removed. This forms the metal layer 41A, which includes the metal foil 50 and the first and second rod conductors 53 and 54.

In the first embodiment, a sheet of insulating resin is used as the insulating resins 43A and 43B that form the resin layer 42. However, a liquid or paste of insulating resin may be used as the material of the insulating resins 43A and 43B.

Figure 8:
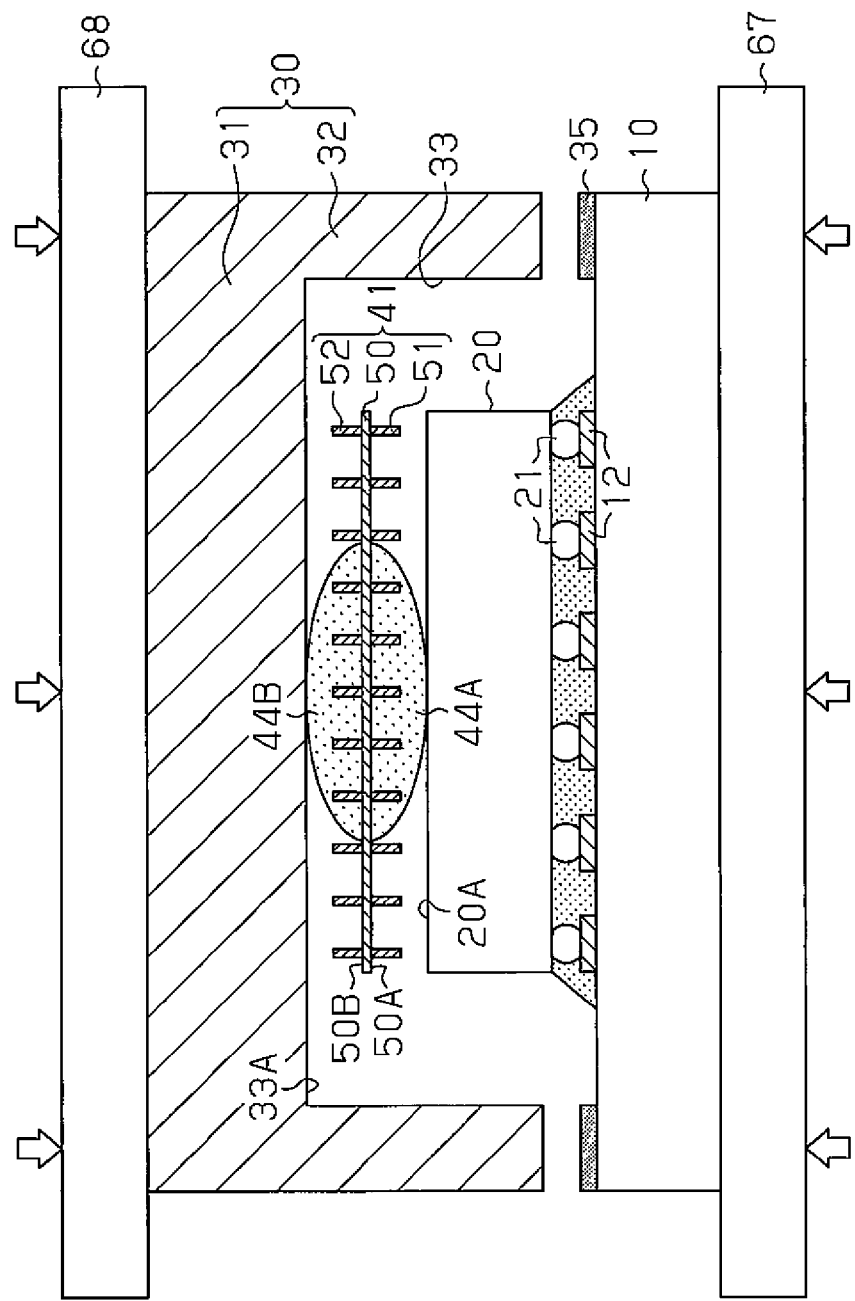
FIG. 8 is a schematic cross-sectional view of a thermal interface material and a semiconductor device in a modified example and illustrates a method for manufacturing the thermal interface material and the semiconductor device.

In the first embodiment, the semiconductor device 1 is manufactured using the thermal interface material 40, which is manufactured separately from the wiring board 10 and covered by the protective films 63 and 64. However, the manufacturing method is not limited in such a manner, and the manufacturing of a thermal interface material 40 may be performed at the same time as when joining the semiconductor element 20 and the heat radiation plate 30 with the thermal interface material. For example, as illustrated in FIG. 8, the wiring board 10, which includes the connection terminals 21 of the semiconductor element 20 flip-chip joined with the connecting pads 12, the heat radiation plate 30, and the metal layer 41, which is manufactured through the method of FIGS. 3A to 3E, are prepared. Next, at the middle portions of the upper and lower surfaces of the metal foil 50 in the metal layer 41, a paste of insulating resin 44A and a paste of insulating resin 44B are formed in heaps by performing printing or the like. Then, the heat radiation plate 30 is aligned with the wiring board 10 such that the sidewall portion 32 of the heat radiation plate 30 faces the joining material 35 on the wiring board 10 and the inner bottom surface 33A of the recess 33 of the heat radiation plate 30 faces the semiconductor element 20. Then, the heat radiation plate 30 is stacked on the wiring board 10 such that the upper surface 20A of the semiconductor element 20 comes into contact with the insulating resin 44A on the first surface 50A of the metal foil 50 and the inner bottom surface 33A of the recess 33 of the heat radiation plate 30 comes into contact with the insulating resin 44B on the second surface 50B of the metal foil 50. Next, the structural element stacked in this manner is arranged between a lower heating press plate 67 and an upper heating press plate 68. The structural element is then heated and pressed (i.e., hot-pressed) from above and below by a vacuum press. As a result, as illustrated in FIG. 9, the insulating resins 44A and 44B, which are in semi-cured state, are spread out in the planar direction when pressed by the upper surface 20A of the semiconductor element 20 and the inner bottom surface 33A of the heat radiation plate 30. The spread insulating resins 44A and 44B cover the metal layer 41. Further, the heating and pressing thermally cures the insulating resins 44A and 44B and forms a resin layer 42C. In this manner, the metal layer 41 covered by the resin layer 42C forms a thermal interface material 40B, and the semiconductor element 20 and the heat radiation plate 30 are joined by the thermal interface material 40B. Further, the joining material 35 is thermally cured by the heating and pressing, and the cured joining material 35 joins the wiring board 10 and the heat radiation plate 30.

In such a method, the manufacturing of the thermal interface material 40B may be performed at the same time as when joining the semiconductor element 20 and the heat radiation plate 30 with the thermal interface material 40B. Further, the heating and pressing uniformly spreads the insulating resins 44A and 44B in the planar direction. This prevents voids from forming in the insulating resins 44A and 44B (the resin layer 42).

A second embodiment of a thermal interface material, a method for manufacturing a thermal interface material, and a joining structure using a thermal interface material will now be described with reference to FIGS. 10 and 11. The second embodiment differs from the first embodiment in the structure of the thermal interface material. The differences from the first embodiment will be described below in detail. Like or same reference numerals are given to those components that are the same as the corresponding components illustrated in FIGS. 1 to 9. Such components will not be described in detail.

A method for manufacturing a thermal interface material 40C will now be described with reference to FIGS. 10A to 10G.

Figure 10A:
FIGS. 10A to 10G are schematic cross-sectional views of a thermal interface material according to a second embodiment illustrating a method for manufacturing the thermal interface material.

As illustrated in FIG. 10A, to manufacture the thermal interface material 40C, the metal foil 50 is first prepared. In the present embodiment, copper foil is used as the metal foil 50.

Figure 10B:
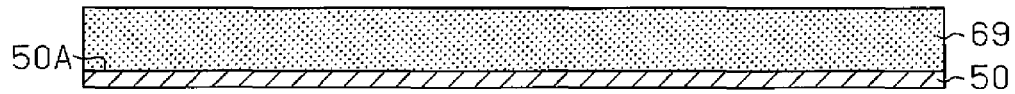
Figure 10C:
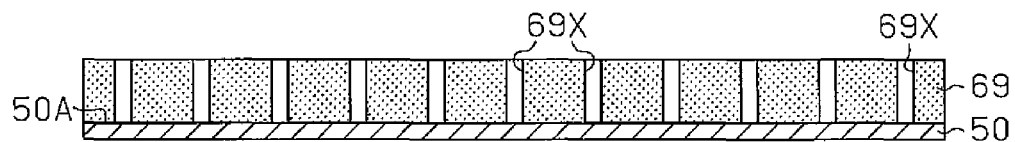

In the next step illustrated in FIG. 10B, an insulating layer 69 is formed to cover the first surface 50A (in FIG. 10B, the upper surface) of the metal foil 50. As the material for the insulating layer 69, a photosensitive material or a non-photosensitive material may be used. For example, a dry film resist or a liquid resist may be used. The thickness of the insulating layer 69 is about 10 to 100 μm, for example. At the following step illustrated in FIG. 10C, openings 69X are formed at given portions of the insulating layer 69 to expose the first surface 50A of the metal foil 50.

Figure 10D:
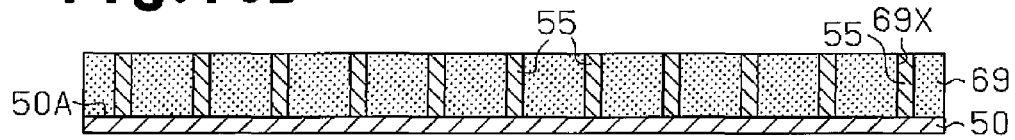

In the step illustrated in FIG. 10D, the first surface 50A of the metal foil 50 undergoes electroplating using the metal foil 50 as a plating power supplying layer and using the insulating layer 69 as a plating mask. By electroplating (in this case, copper electroplating) the metal foil 50 exposed from the openings 69X of the insulating layer 69, rod conductors 55 are formed on the first surface 50A of the metal foil 50. The rod conductors 55 extend upward from the first surface 50A of the metal foil 50. Each rod conductor 55 is formed to be circular as viewed from above. The rod conductors 55 are arranged in the planar direction (in FIG. 10E, sideward direction) on the first surface 50A of the metal foil 50. Further, the rod conductors 55 are arranged on the first surface 50A of the metal foil 50 in a matrix form as viewed from above in the same manner as the first and second rod conductors 51 and 52 of the first embodiment. The height of the rod conductors 55 may be set to, for example, about 10 to 100 μm, the diameter of the rod conductors 55 may be set to, for example, about 10 to 500 μm, and the pitch between the rod conductors 55 may be set to, for example, about 10 to 500 μm.

Figure 10E:
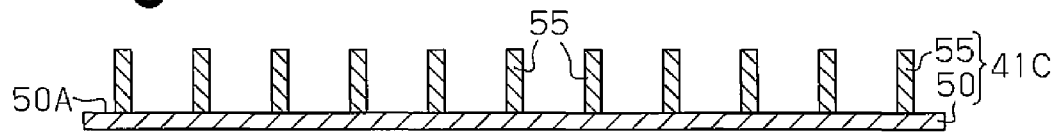

In the step illustrated in FIG. 10E, the insulating layer 69 used as the plating mask is removed. This forms a metal layer 41C, which includes the metal foil 50 and the rod conductors 55 arranged on the first surface 50A of the metal foil 50. In the metal layer 41C, the rod conductors 55 extend in the vertical direction from the first surface 50A of the thin film-shaped metal foil 50. That is, the metal layer 41C has a substantially comb-shaped cross-section.

Figure 10F:
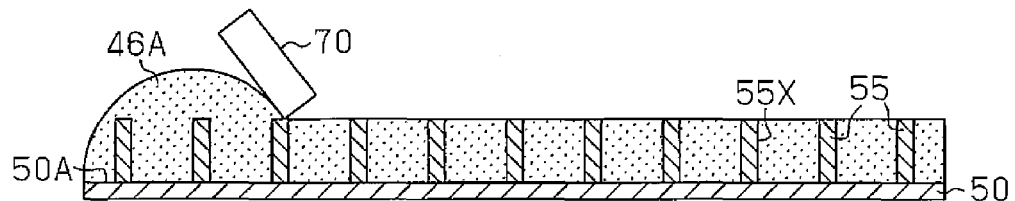

In the step illustrated in FIG. 10F, a paste of insulating resin 46A is arranged on one end of the first surface 50A of the metal foil 50. Then, a squeegee 70 moves and applies the insulating resin 46A in the sideward direction to fill the insulating resin 46A in recesses 55X formed between the adjacent rod conductors 55. As the insulating resin 46A, a thermosetting resin having a low elastic modulus, such as a silicone resin or an epoxy resin, may be used. The insulating resin 46A is used in a B-stage state (semi-cured state). Instead of using the squeegee 70, printing (such as screen printing) may be performed to apply the insulating resin 46A.

Figure 10G:
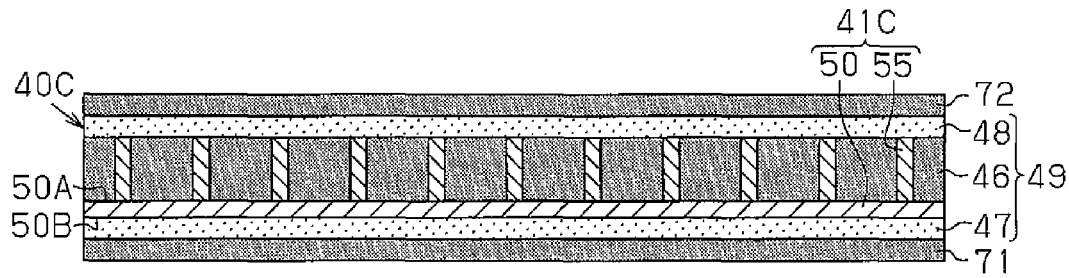

Then, a heat treatment is performed to cure the insulating resin 46A. As illustrated in FIG. 10G, this forms an insulating layer 46 that covers the first surface 50A of the metal foil 50 and the side surfaces of the rod conductors 55.

In the step illustrated in FIG. 10G, the second surface 50B of the metal foil 50 is covered by a first adhesive layer 47 with a protective film 71, and a surface (upper surface in FIG. 10G) of the insulating layer 46 is covered by a second adhesive layer 48 with a protective film 72. The insulating layer 46 and the first and second adhesive layers 47 and 48 form a resin layer 49 that covers the metal layer 41C. As the material for the first and second adhesive layers 47 and 48, a thermosetting resin having a low elastic modulus, such as a silicone resin or an epoxy resin, may be used. The first and second adhesive layers 47 and 48 are used in a B-stage state (semi-cured state). To cover the first and second adhesive layers 47 and 48, a resin film may be laminated on the two surfaces of a structural element obtained by forming the insulating layer 46 on the metal layer 41C, for example.

The above manufacturing steps manufacture the thermal interface material 40C that is covered by the protective films 71 and 72. The thermal interface material 40C includes the metal layer 41C, which has the metal foil 50 and the rod conductors 55, the insulating layer 46, which covers the first surface 50A of the metal foil 50 and the side surfaces of the rod conductors 55, the first adhesive layer 47, which covers the second surface 50B of the metal foil 50, and the second adhesive layer 48, which covers the upper surface of the insulating layer 46 and the upper surfaces of the rod conductors 55.

Figure 11:
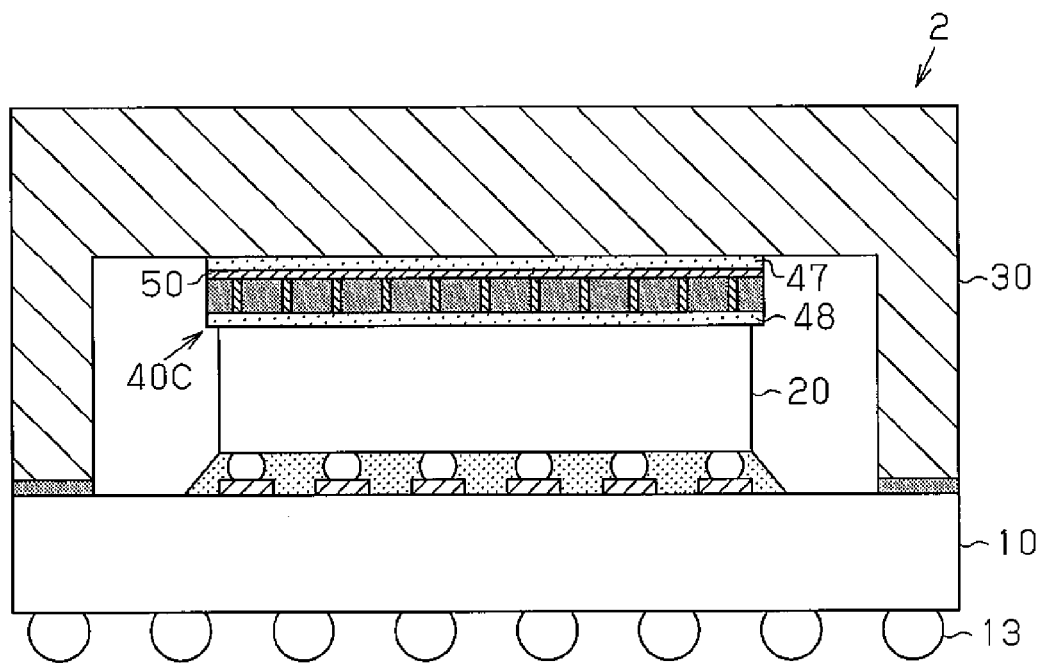
FIG. 11 is a schematic cross-sectional view of a semiconductor device illustrating a method for manufacturing the semiconductor device using the thermal interface material of FIG. 10G.

In the step illustrated in FIG. 11, after removing the protective films 71 and 72 from the thermal interface material 40C, the thermal interface material 40C and the heat radiation plate 30 are stacked on the wiring board 10 with the thermal interface material 40C arranged between the semiconductor element 20 and the heat radiation plate 30 in the same manner as the steps illustrated in FIGS. 5A and 5B. In the present embodiment, the thermal interface material 40C is arranged such that the first adhesive layer 47, which is formed on the second surface 50B of the metal foil 50, comes into contact with the heat radiation plate 30, and such that the second adhesive layer 48 comes into contact with the semiconductor element 20. That is, the metal foil 50 of the thermal interface material 40C is arranged closest to the heat radiation plate 30 between the first and the second adhesive layers 47 and 48. In the present embodiment, the semiconductor element 20 is formed from silicon and has a thermal expansion coefficient of about 3 ppm/° C., and the heat radiation plate 30 is formed from copper and has a thermal expansion coefficient of about 17 ppm/° C. In this case, the metal foil 50 is arranged physically close to the joined member (here, the heat radiation plate 30), which has a thermal expansion coefficient that is close to that of the metal foil 50 (about 17 ppm/° C.).

The structural element of the stacked wiring board 10, thermal interface material 40C, and heat radiation plate 30 is arranged between two heating press plates, for example. Then, the structural element is heated and pressed from above and below by a vacuum press to form the integral structure illustrated in FIG. 11. The heating and pressing thermally cures the first and second adhesive layers 47 and 48 of the thermal interface material 40C, and the semiconductor element 20 and the heat radiation plate 30 are joined by the thermal interface material 40C. Then, the solder balls 13 are formed. This obtains a semiconductor device 2.

In addition to advantages (1) to (3) of the first embodiment, the second embodiment has the following advantage.

(4) The metal foil 50 is arranged physically close to the joined member (in the present embodiment, the heat radiation plate 30), which has a thermal expansion coefficient that is close to the thermal expansion coefficient of the metal foil 50 (about 17 ppm/° C.). As a result, when the temperature changes, the metal foil 50 deforms (contracts or expands) in the same manner as the heat radiation plate 30. This prevents the metal foil 50 from restricting elastic deformation of the insulating layer 46 and the adhesive layer 47. Further, the metal foil 50 is deformed in the same manner as the heat radiation plate 30 and thus does not restrict deformation of the rod conductors 55 connected to the metal foil 50. Accordingly, the movement range of the rod conductors 55 may be enlarged.

A third embodiment of a thermal interface material, a method for manufacturing a thermal interface material, and a joining structure using a thermal interface material will now be described with reference to FIGS. 12 and 13. The third embodiment differs from the first and second embodiments in the structure of the thermal interface material. The differences from the first and second embodiments will be described below in detail. Like or same reference numerals are given to those components that are the same as the corresponding components illustrated in FIGS. 1 to 11. Such components will not be described in detail.

A method for manufacturing a thermal interface material 40D will now be described with reference to FIGS. 12A to 12E.

Figure 12A:
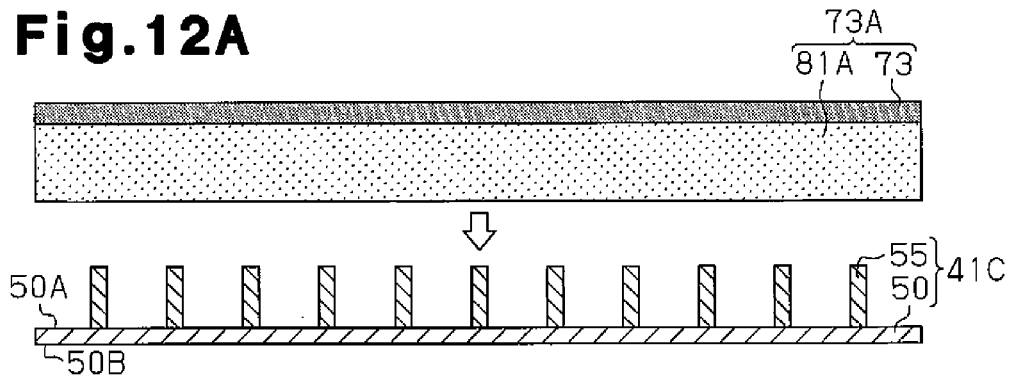
FIGS. 12A to 12E are schematic cross-sectional views of a thermal interface material according to a third embodiment illustrating a method for manufacturing the thermal interface material.

In the step illustrated in FIG. 12A, the metal layer 41C, which is manufactured through the same manufacturing steps as those illustrated in FIGS. 10A to 10E, is prepared. Also, a structural element 73A, which is formed by adhering a sheet of insulating resin 81A to a protective film 73, is prepared. As the protective film 73, a film made by laminating a thin fluororesin layer on a polyester film or a PET film, a film made by applying a parting agent to a surface of a polyester film or a PET film, or the like may be used. As the parting agent, a silicone-based parting agent or a fluorine-based parting agent may be used. The insulating resin 81A is adhered to the surface of the protective film 73 to which the parting agent has been applied. The thickness of the protective film 73 may be set to about 10 to 50 μm, for example. As the material for the insulating resin 81A, a thermosetting resin having a low elastic modulus, such as a silicone resin or an epoxy resin, may be used. The insulating resin 81A is used in a B-stage state (semi-cured state). The thickness of the insulating resin 81A may be set at a value allowing the insulating resin 81A to cover the rod conductors 55 of the metal layer 41C, for example, about 15 to 110 μm.

Figure 12B:
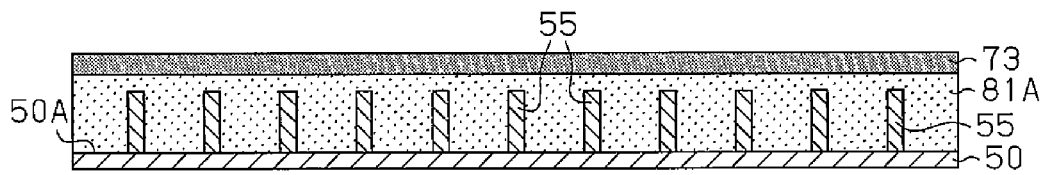

In the step illustrated in FIG. 12A, the structural element 73A is arranged at the upper side of the metal layer 41C (the rod conductors 55). Here, the structural element 73A is arranged in a state in which the insulating resin 81A is directed downward such that the insulating resin 81A faces the metal layer 41C. Then, thermal compression bonding is performed to laminate the sheet-shaped structural element 73A on the first surface 50A of the metal foil 50. As illustrated in FIG. 12B, the thermal compression bonding press-fits the rod conductors 55 into the insulating resin 81A. This covers the first surface 50A of the metal foil 50 and the rod conductors 55 with the insulating resin 81A. In this step, the insulating resin 81A is kept in the B-stage state and not thermally cured. By laminating the insulating resin 81A in a vacuum atmosphere, the formation of voids in the insulating resin 81A may be prevented.

Figure 12C:
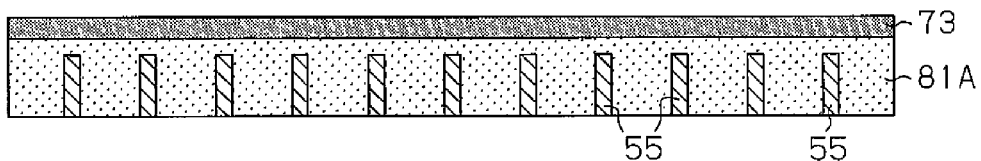

In the step illustrated in FIG. 12C, the metal foil 50 of FIG. 12B is removed. When copper foil is used as the metal foil 50, for example, the metal foil 50 may be removed through wet etching using an aqueous solution of ferric chloride, an aqueous solution of cupric chloride, an aqueous solution of ammonium persulfate, or the like.

Figure 12D:
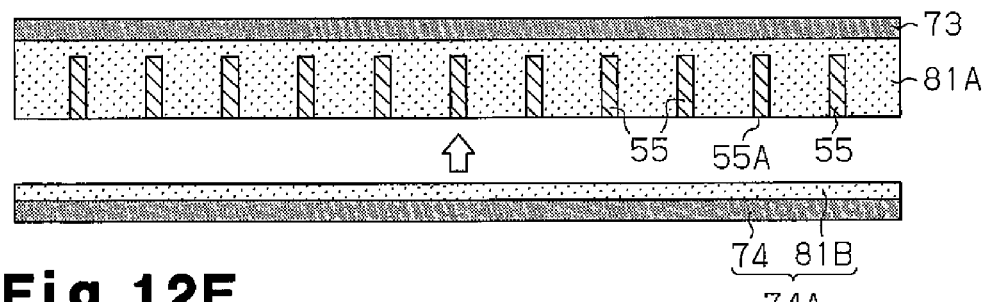

In the step illustrated in FIG. 12D, a structural element 74A, which is formed by adhering a sheet of insulating resin 81B to a protective film 74, is prepared. As the protective film 74, a film made by laminating a thin fluororesin layer on a polyester film or a PET film, a film made by applying a parting agent to a surface of a polyester film or a PET film, or the like may be used. As the parting agent, a silicone-based parting agent or a fluorine-based parting agent may be used. The insulating resin 81B is adhered to the surface of the protective film 74 to which the parting agent is applied. The thickness of the protective film 74 may be set at about 10 to 50 μm, for example. As the material for the insulating resin 81B, the same material as that for the insulating resin 81A may be used, that is, a thermosetting resin having a low elastic modulus, such as a silicone resin or an epoxy resin, may be used. The insulating resin 81B is used in a B-stage state (semi-cured state). The thickness of the insulating resin 81B may be set at a value allowing for the insulating resin 81B to cover the lower surfaces 55A of the rod conductors 55, for example, about 1 to 10 μm.

Figure 12E:
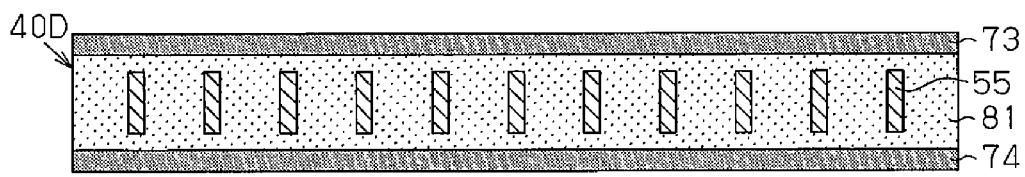

At the step illustrated in FIG. 12D, the structural element 74A is arranged at the lower side of the insulating resin 81A. Here, the structural element 74A is arranged with the insulating resin 81B directed upward such that the insulating resin 81B faces the insulating resin 81A. Then, thermal compression bonding is performed to laminate the sheet-shaped structural element 74A on the insulating resin 81A. As illustrated in FIG. 12E, the thermal compression bonding forms a resin layer 81 with the insulating resins 81A and 81B, and the rod conductors 55 are press-fitted in the resin layer 81. In this step, the resin layer 81 (the insulating resins 81A and 81B) is kept in a B-stage state and not thermally cured.

The above manufacturing steps obtain the thermal interface material 40D covered by the protective films 73 and 74. The thermal interface material 40D includes the rod conductors 55 that extend in the thickness direction of the thermal interface material 40D and are arranged to be in parallel. Further, the thermal interface material 40D includes the resin layer 81 that covers the rod conductors 55.

Figure 13:
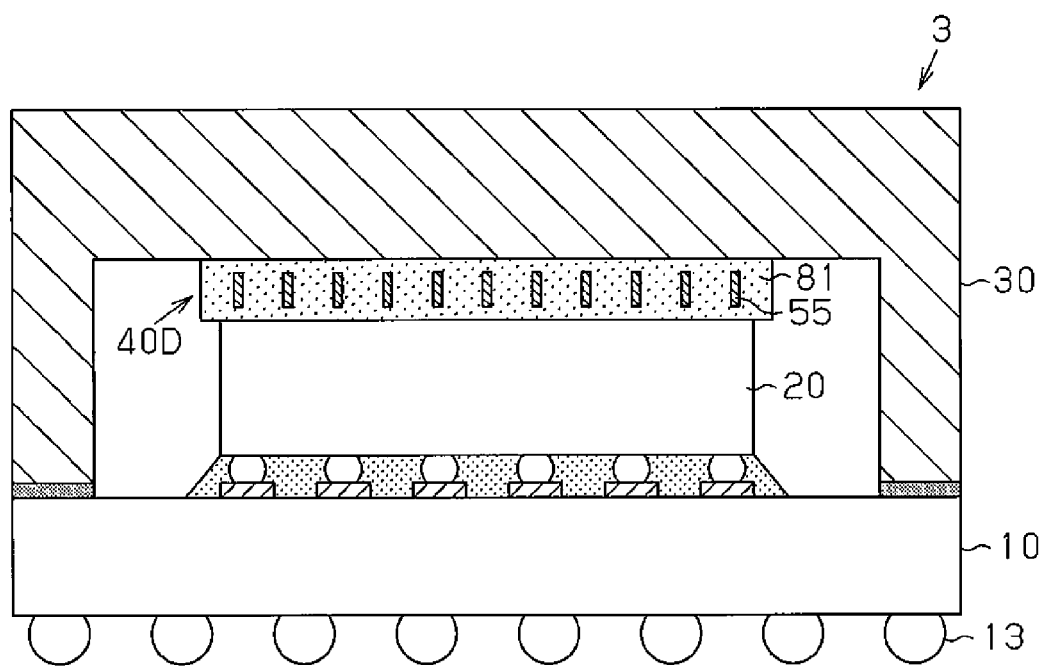
FIG. 13 is a schematic cross-sectional view of a semiconductor device illustrating a method for manufacturing the semiconductor device using the thermal interface material of FIG. 12E.

In the step illustrated in FIG. 13, after removing the protective films 73 and 74 from the thermal interface material 40D, the wiring board 10, thermal interface material 40D, and heat radiation plate 30 are stacked with the thermal interface material 40D arranged between the semiconductor element 20 and the heat radiation plate 30 in the same manner as the steps illustrated in FIGS. 5A and 5B. Then, the structural element of the stacked wiring board 10, thermal interface material 40D, and heat radiation plate 30 is arranged between two heating press plates, for example. A vacuum press or the like heats and presses the structural element from above and below to form the integral structure of FIG. 13. The heating and pressing thermally cures the resin layer 81 of the thermal interface material 40D, and the semiconductor element 20 and the heat radiation plate 30 are joined by the thermal interface material 40D. Then, the solder balls 13 are formed to obtain a semiconductor device 3.

The third embodiment obtains advantage (1) of the first embodiment.

It should be apparent to those skilled in the art that the aforementioned embodiments may be embodied in many other specific forms without departing from the spirit or scope of the invention. Particularly, it should be understood that the invention may be embodied in the following forms.

Figure 14A:
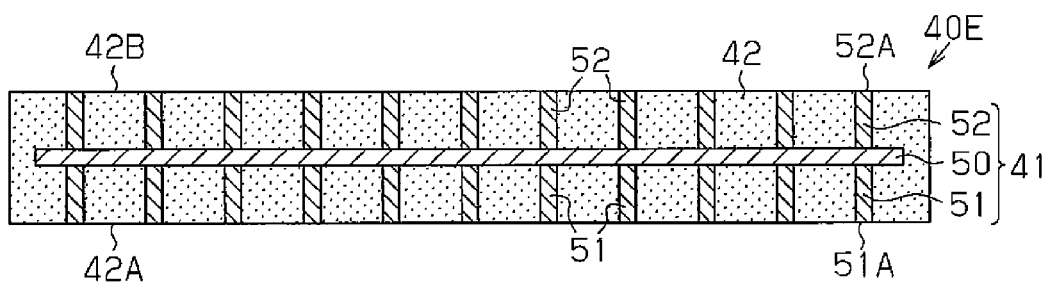
FIGS. 14A to 14C are schematic cross-sectional views of a thermal interface material in a modified example.

The thermal interface material 40 of the first embodiment is formed to cover the metal layer 41 with the resin layer 42. However, the entire surface of the metal layer 41 does not have to be covered by the resin layer 42. A thermal interface material may have a structure in which the resin layer 42 covers the first surface 50A and the second surface 50B of the metal foil 50, the side surfaces of the first rod conductors 51, and the side surfaces of the second rod conductors 52. For example, FIG. 14A illustrates a thermal interface material 40E in a modified example. As illustrated in FIG. 14A, the lower surfaces 51A of the first rod conductors 51 may be exposed from the lower surface 42A of the resin layer 42. Further, the upper surfaces 52A of the second rod conductors 52 may be exposed from the upper surface 42B of the resin layer 42. In this case, the lower surfaces 51A of the first rod conductors 51 may be flush with the lower surface 42A of the resin layer 42. Likewise, the upper surfaces 52A of the second rod conductors 52 may be flush with the upper surface 42B of the resin layer 42. In the thermal interface material 40E, the first and second rod conductors 51 and 52 directly come into contact with the joined members (the semiconductor element 20 and the heat radiation plate 30). Thus, the thermal conductivity may be increased.

Figure 14B:
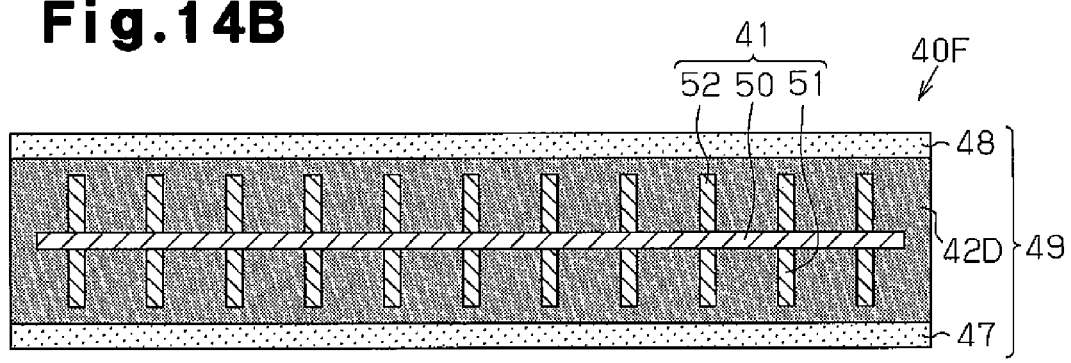

FIG. 14B illustrates a thermal interface material 40F in another modified example. As illustrated in FIG. 14B, the resin layer 42 of the thermal interface material 40 in the first embodiment may be replaced by an insulating layer 42D. The insulating layer 42D may be formed by completely curing the resin layer 42 in a step prior to the arrangement of the thermal interface material 40 (40F) between the joined members (the semiconductor element 20 and the heat radiation plate 30). In this case, the first adhesive layer 47 and the second adhesive layer 48 are respectively arranged on the lower surface and the upper surface of the insulating layer 42D. The insulating layer 42D and the first and second adhesive layers 47 and 48 form a resin layer 49 that covers the metal layer 41. In this structure, the insulating layer 42D is one example of the first insulating layer, and the first and second adhesive layers 47 and 48 are each an example of the second insulating layer.

Figure 14C:
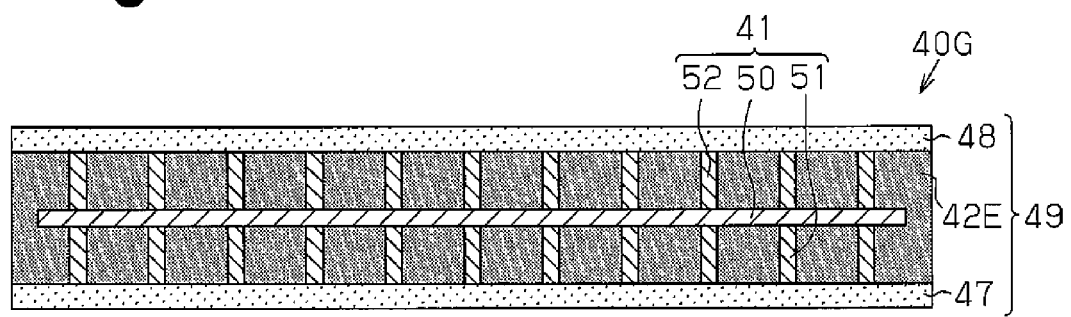

FIG. 14C illustrates a thermal interface material 40G in a further modified example. As illustrated in FIG. 14C, the resin layer 42 of the thermal interface material 40E of FIG. 14A may be replaced by an insulating layer 42E. The insulating layer 42E may be formed by completely curing the resin layer 42 in a step prior to the arrangement of the thermal interface material 40E (40G) between the joined members (the semiconductor element 20 and the heat radiation plate 30). In this case, the first adhesive layer 47 and the second adhesive layer 48 are respectively arranged on the lower surface and the upper surface of the insulating layer 42E. The insulating layer 42E and the first and second adhesive layers 47 and 48 form a resin layer 49 that covers the metal layer 41. In this structure, the insulating layer 42E is one example of the first insulating layer, and the first and second adhesive layers 47 and 48 are each an example of the second insulating layer.

Figure 15:
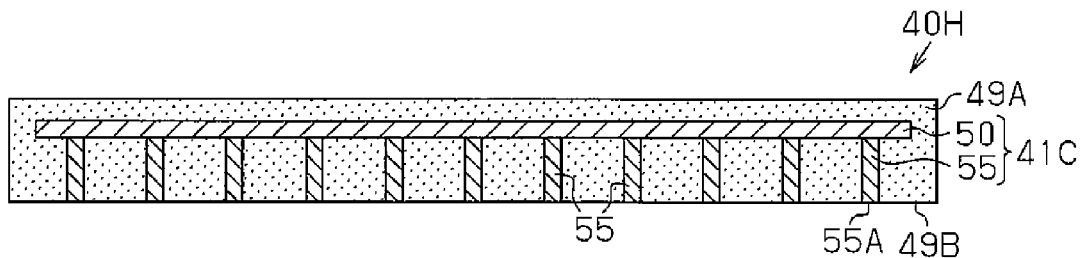
FIG. 15 is a schematic cross-sectional view of a thermal interface material in a modified example.

In the thermal interface material 40C of the second embodiment, the metal layer 41C is covered by the resin layer 49, which includes the completely cured insulating layer 46 and the first and second adhesive layers 47 and 48. Instead, as illustrated in FIG. 15, the metal layer 41C may be covered by a resin layer 49A, which is in a semi-cured state. In a thermal interface material 40H of FIG. 15, the lower surfaces 55A of the rod conductors 55 may be exposed from the lower surface 49B of the resin layer 49A. Further, the entire surface of the metal layer 41C may be covered by the resin layer 49A.

Figure 16:
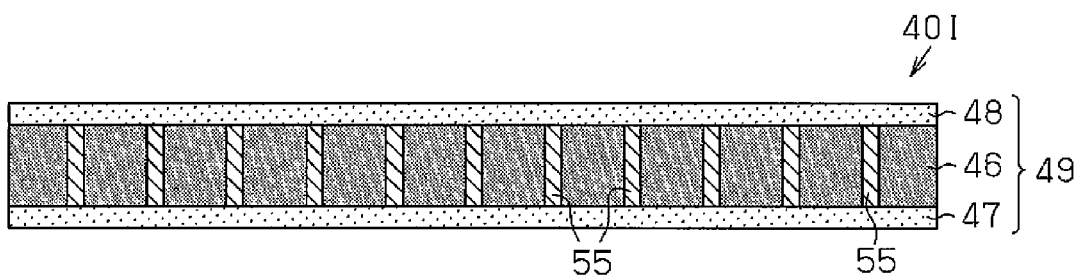
FIG. 16 is a schematic cross-sectional view of a thermal interface material in a modified example.

As illustrated in FIG. 16, the metal foil 50 may be omitted from the thermal interface material 40C of the second embodiment. A thermal interface material 40I of FIG. 16 includes the rod conductors 55, the insulating layer 46, which covers the side surfaces of the rod conductors 55, and the first and second adhesive layers 47 and 48, which respectively cover the lower surface and the upper surface of the insulating layer 46. In this modified example, the insulating layer 46 and the first and second adhesive layers 47 and 48 form a resin layer. In the thermal interface material 40I, the insulating layer 46 and the first and second adhesive layers 47 and 48 entirely cover the surfaces of the rod conductors 55.

As illustrated in FIGS. 1 to 16, the rod conductors 51 to 55 have straight shapes. However, for example, the rod conductors 51 to 55 may each have a tapered shape in which the diameter increases from its basal end, which is connected to the metal foil 50, to its distal end. When the rod conductors 51 to 55 are tapered in this manner, the area of the metal foil 50 that contacts the rod conductors 51 to 55 is decreased. Therefore, the rod conductors 51 to 55 deform easily when the temperature changes.

In the above embodiments, the joining structure using the thermal interface material is applied to BGA wiring boards. However, the joining structure may be applied to pin grid array (PGA) wiring boards and land grid array (LGA) wiring boards.

Cooling and heat-radiating units, such as radiation fins, a heat pipe, and a vapor chamber, may be arranged above the heat radiation plates 30 in the above embodiments. In such a case, any one of the thermal interface materials 40 and 40A to 40I may be further arranged between the heat radiation plate 30 and the cooling and heat-radiating unit or between cooling and heat-radiating units.

Figure 17:
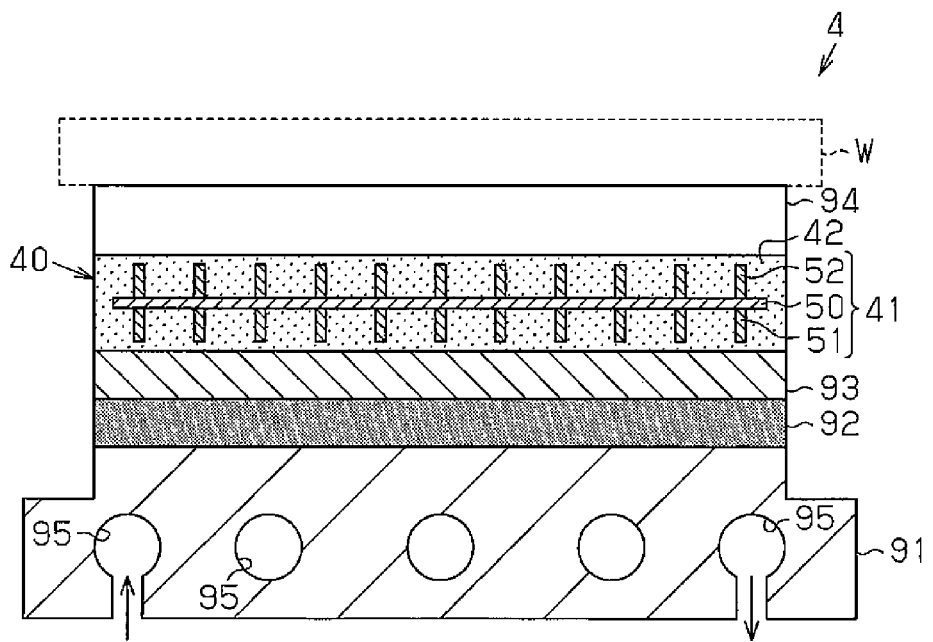
FIG. 17 is a schematic cross-sectional view of an electrostatic chuck in a modified example.

In the above embodiments, the thermal interface materials 40, 40C, and 40D are respectively applied to the semiconductor devices 1, 2, and 3. However, the application of the thermal interface materials 40, 40C, and 40D is not limited in such a manner. The thermal interface materials 40, 40C, and 40D may also be applied to other joining structures (structural elements) as long as a first member having a first thermal expansion coefficient and a second member having a second thermal expansion coefficient are joined and coupled thermally by a thermal interface material. For example, as illustrated in FIG. 17, the thermal interface material 40 may be applied to an electrostatic chuck 4.

The electrostatic chuck 4 basically includes a base plate 91, an adhesive layer 92, a film-shaped heater 93, which is joined with the base plate 91 by the adhesive layer 92, and an electrostatic chuck (ESC) substrate 94, which is joined with the heater 93 by the thermal interface material 40.

The base plate 91 includes a plurality of cooling flow passages 95 arranged in the planar direction. The cooling flow passages 95 are in communication with one another in the base plate 91. As illustrated by the arrow in FIG. 17, a coolant, such as water or galden, flows from the left flow passage 95 to the right flow passage 95 to adjust the temperature of a wafer W, which is electrostatically held on the ESC substrate 94 joined with the base plate 91 through the adhesive layer 92, the heater 93, and the thermal interface material 40, to a given temperature.

The base plate 91 may be used as an electrode for controlling plasma. By supplying given radiofrequency power (for example, plural high-frequency waves) to the base plate 91, energy used for the collision of ions and the like in a plasma state with the wafer W may be controlled to perform etching processing effectively. The base plate 91 may also be used as an electrode for generating plasma.

As the material for the base plate 91, a material having electric conductivity may be used. Examples of the material for the base plate 91 include metal materials, such as aluminum and sintered hard alloys, and composite materials of the metal materials and ceramic materials.

The adhesive layer 92 is provided to maintain favorable heat conduction between the heater 93 and the base plate 91. The heater 93 is provided to heat a wafer W on the ESC substrate 94. However, when the wafer W is rapidly heated by plasma and the like, there is a need to externally dissipate the heat. Also, there is a need to heat the wafer W while conducting heat from the heater 93 to the base plate 91. Therefore, as the material for the adhesive layer 92, it is desirable to select a material having a high coefficient of thermal conductivity, and thus a silicone resin, for example, may be used. Instead of the adhesive layer 92, the thermal interface material 40 may be arranged between the base plate 91 and the heater 93. As the material for the heater 93, a metal, such as aluminum, may be used. In this example, the heater 93 is formed from aluminum, and has a thermal expansion coefficient of about 23 ppm/° C.

Although not illustrated in the drawings, a certain electrode layer needed is embedded in the ESC substrate 94. For example, the electrode layer is embedded in the ESC substrate 94 in a portion near the electrostatic chucking surface of the ESC substrate 94 that holds a wafer W. DC voltage for electrostatic chucking is applied to the electrode layer. Further, when necessary, a plurality of electrode layers, which are supplied with radiofrequency power for plasma control, may be embedded at a portion of the ESC substrate 94 opposite to the chucking surface.

As the material for the ESC substrate 94, a material having insulation properties may be used. Examples of the material for the ESC substrate 94 include ceramic materials such as silicon nitride, alumina, aluminum nitride, and organic materials such as silicone resin and polyimide resin. In this example, the ESC substrate 94 is formed from a ceramic material, and has a thermal expansion coefficient of about 5 to 7 ppm/° C. Further, the ESC substrate 94 is formed such that the ESC substrate 94 is somewhat smaller than a wafer W (e.g., 450 mm×450 mm) that is electrostatically held on the ESC substrate 94. Thus, at least the electrostatic chucking surface of the ESC substrate 94 is not exposed to plasma.

The thermal interface material 40, which is arranged between the heater 93 and the ESC substrate 94, serves to maintain favorable heat conduction between the heater 93 and the ESC substrate 94 and to join the heater 93 and the ESC substrate 94. Further, the thermal interface material 40 serves to relieve stress caused by the difference in thermal expansion coefficients between the heater 93 and the ESC substrate 94. The thickness of the thermal interface material 40 (the resin layer 42) to be applied to such a structural element may be set at about 100 to 220 µm, for example. In that case, the thickness of the metal foil 50 may be set at about 5 to 20 µm, for example; the thickness of the rod conductors 51 and 52 may be set at about 40 to 100 µm, for example; the diameter of the rod conductors 51 and 52 may be set at about 10 to 500 µm, for example; and both the pitch between the rod conductors 51 and the pitch between the rod conductors 52 may be set at about 10 to 500 µm, for example. The thermal interface material 40 is formed such that the size of the thermal interface material 40 is about the same as that of the ESC substrate 94. In this manner, the thermal interface material 40 may also be applied to large devices such as the electrostatic chuck 4 of FIG. 17.

The present examples and embodiments are to be considered as illustrative and not restrictive, and the invention is not to be limited to the details given herein, but may be modified within the scope and equivalence of the appended claims.

The invention claimed is:

1. A joining structure comprising:
    a first member which has a first thermal expansion coefficient;

a second member which has a second thermal expansion coefficient that differs from the first thermal expansion coefficient; and
a thermal interface material arranged between the first member and the second member to thermally couple the first member and the second member; wherein:
the thermal interface material includes:
    a metal layer including
        a metal foil including a first surface and an opposite second surface,
        a plurality of first rod conductors each including a side surface extending in a stacked direction of the first and second members, wherein the first rod conductors are arranged on the first surface of the metal foil in a planar direction that is perpendicular to the stacked direction, and
        a plurality of second rod conductors each including a side surface extending in the thickness direction, wherein the second rod conductors are arranged on the second surface of the metal foil in the planar direction; and
    a resin layer that covers at least the first surface and the second surface of the metal foil, the side surfaces of the first rod conductors, and the side surfaces of the second rod conductors;
a ratio of a height of the first rod conductors and a height of the second rod conductors is set to be the same as a ratio of a difference between a thermal expansion coefficient of the metal foil and the first thermal expansion coefficient and a difference between the thermal expansion coefficient of the metal foil and the second thermal expansion coefficient;
the first member and the second member are in contact with the resin layer exposed from the thermal interface material so that the thermal interface material joins the first member and the second member;
the first member is joined to the thermal interface material at the side at which the first surface of the metal foil is located; and
the second member is joined to the thermal interface material at the side at which the second surface of the metal foil is located.

* * * * *